US012244321B2

(12) United States Patent
Poon

(10) Patent No.: US 12,244,321 B2
(45) Date of Patent: Mar. 4, 2025

(54) HYBRID ANALOG/DIGITAL CIRCUIT FOR SOLVING NONLINEAR PROGRAMMING PROBLEMS

(71) Applicant: The Board of Trustees of the Leland Stanford Junior University Office of the General Counsel, Stanford, CA (US)

(72) Inventor: Jason Poon, Palo Alto, CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 113 days.

(21) Appl. No.: 18/271,451

(22) PCT Filed: Jan. 29, 2022

(86) PCT No.: PCT/US2022/014463
§ 371 (c)(1),
(2) Date: Jul. 8, 2023

(87) PCT Pub. No.: WO2022/165287
PCT Pub. Date: Aug. 4, 2022

(65) Prior Publication Data
US 2024/0056089 A1    Feb. 15, 2024

Related U.S. Application Data

(60) Provisional application No. 63/143,856, filed on Jan. 30, 2021.

(51) Int. Cl.
*H03M 1/06* (2006.01)
*G06F 17/10* (2006.01)
(Continued)

(52) U.S. Cl.
CPC ........... *H03M 1/0614* (2013.01); *G06F 17/10* (2013.01); *G06F 17/11* (2013.01); *H03M 1/12* (2013.01)

(58) Field of Classification Search
CPC ....... H03M 1/0614; H03M 1/12; G06F 17/10; G06F 17/11
See application file for complete search history.

(56) References Cited

U.S. PATENT DOCUMENTS

2015/0242360 A1* 8/2015 Lustig .................... G06F 17/11
708/208

FOREIGN PATENT DOCUMENTS

WO    WO2020176538 A1    9/2020

OTHER PUBLICATIONS

Guo et al. Energy-Efficient Hybrid Analog/Digital Approximate Computation in Continuous Time. IEEE Journal of Solid-State Circuits, vol. 51, No. 7, Jul. 2016, pp. 1514-1524.

* cited by examiner

*Primary Examiner* — Joseph J Lauture
(74) *Attorney, Agent, or Firm* — LUMEN PATENT FIRM

(57) ABSTRACT

A hybrid analog-digital electronic circuit for solving nonlinear programming problems includes an analog circuit and a digital microcontroller interconnected to each other by an analog-to-digital converter (ADC) and a digital-to-analog converter (DAC). The analog circuit physically realizes a nonlinear programming problem (NLP) where voltages in the analog circuit represent variables in the NLP, and the interconnection of the analog circuit components enforce Karush-Kuhn-Tucker (KKT) conditions on the variables, such that the voltages in the analog circuit that represent the variables of the NLP naturally converge to an optimal and feasible solution of the NLP. The digital microcontroller sets the voltages in the analog circuit at particular nodes in the (Continued)

analog circuit through the DAC, where the voltages set at the particular nodes determine a precise cost function to be minimized by the analog circuit, where the voltages set at the particular nodes are computed by the digital microcontroller based on measurements obtained from the analog circuit through the ADC.

3 Claims, 15 Drawing Sheets

(51) Int. Cl.
*G06F 17/11* (2006.01)
*H03M 1/12* (2006.01)

*Fig. 4A*
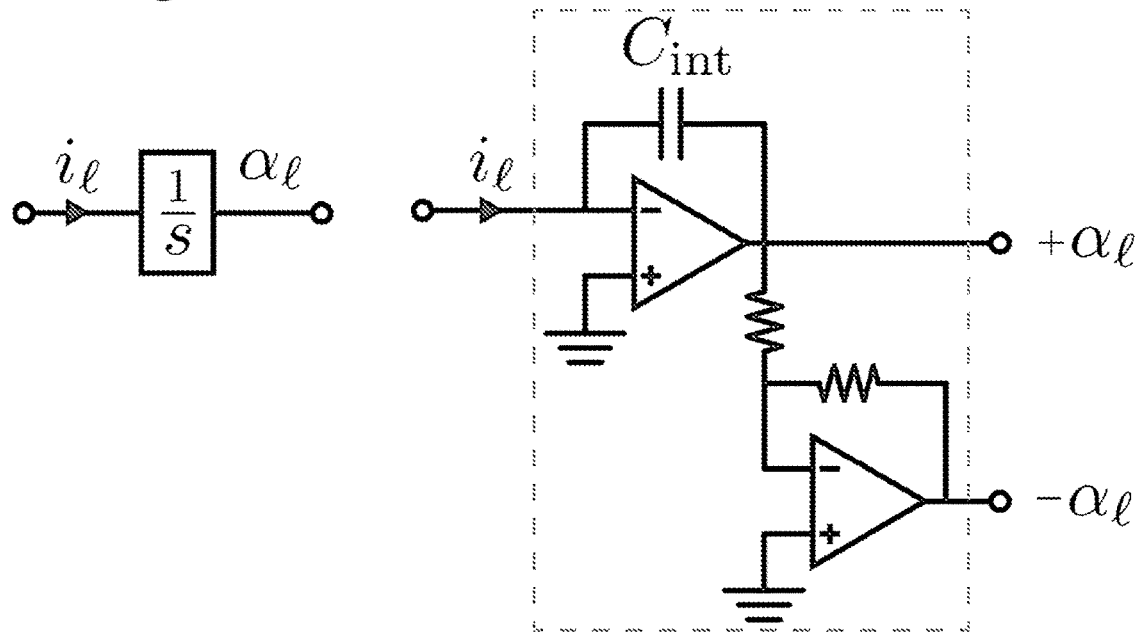
*Fig. 4B*
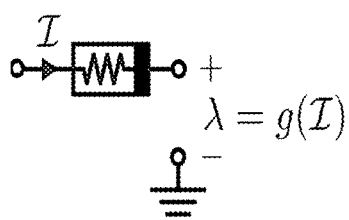
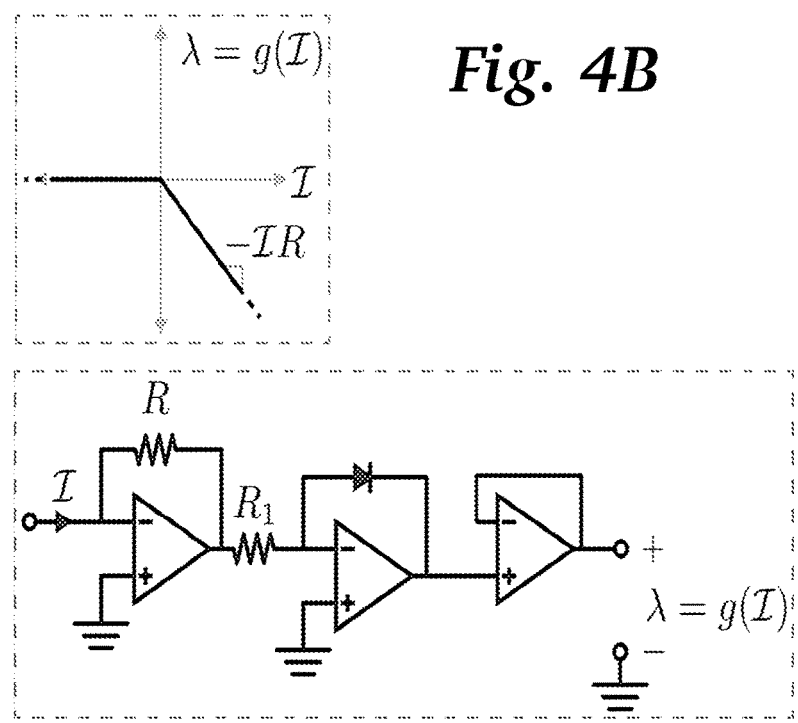

Harmonic Magnitude [p.u.]

HYBRID ANALOG/DIGITAL CIRCUIT FOR SOLVING NONLINEAR PROGRAMMING PROBLEMS

FIELD OF THE INVENTION

The invention relates generally to electronic circuits for analog computation. More specifically, it relates to analog circuits for solving nonlinear programming problems.

BACKGROUND OF THE INVENTION

Nonlinear programming (NLP) is an important method used in a variety of power and energy systems to solve optimization problems in which the objective function or constraints are nonlinear. Some examples of NLP-based control problems include model predictive control, optimal power flow, state and parameter estimation, and motor control.

Existing implementations of these control problems are typically implemented using digital microcontrollers, FPGAs, GPUs, or CPUs. These digital implementations suffer from two key drawbacks: 1) they are too computationally complex to run in real-time, and 2) their high computational complexity necessitates digital microcontrollers/computers that can draw substantial amounts of power. These drawbacks limit the applicability and widespread adoption of such techniques, particularly in power and energy applications, where cost and energy efficiency are important considerations. In other application domains, analog computing techniques have shown promise in enabling lower power and faster computing systems. However, many of these techniques are not tailored to the types of problems that are relevant to power conversion systems, and others lack the programmability and flexibility needed to be used effectively in practical applications.

BRIEF SUMMARY OF THE INVENTION

Herein is disclosed a hybrid analog/digital computing circuit that is capable of solving online optimization and optimal control techniques, and more specifically nonlinear programming problems, in a fast and energy efficient manner (e.g., for power and energy applications). The circuit combines a purely analog computing circuit with a low power digital microcontroller. The addition of the digital microcontroller endows the circuit with flexibility and scalability in programming the desired optimization or control technique, while adding minimal overhead in terms of cost and power.

General NLPs with arbitrary cost functions can be programmed and solved by the circuit. Problems of this form from the power and energy application area include the optimal power flow problem, model predictive control (e.g., model predictive direct torque control), maximum power point tracking for energy harvesting (e.g. solar and wind energy systems), and optimal control of motor drive systems.

The circuit is a physical realization of the desired NLP such that voltages in the circuit represent variables in the NLP, and the interconnection of the circuit components enforce the Karush-Kuhn-Tucker (KKT) conditions on these variables. The KKT conditions provide the first order necessary conditions for the optimal solutions to the NLP given a set of constraints on the variables. Thus, in steady state, the voltages in the circuit that represent the variables of the NLP naturally converge to an optimal and feasible solution of the NLP. Particular nodes in the electronic circuit are driven by (have their voltages set by) a digital microcontroller. These voltages dictate the cost function that is minimized by the electronic circuit. In this way, the digital microcontroller can be programmed to implement arbitrary cost functions that will subsequently be minimized by the electronic circuit. The precise voltages are computed by the digital microcontroller based on voltage measurements of particular nodes from the electronic circuit.

In one example implementation, an embodiment of the circuit is used for a specific online optimization problem called selective harmonic minimization, in which the pulse-width modulation (PWM) of a power converter typically a two-level or multilevel inverter is optimally calculated to precisely control or minimize the output harmonic content. Due to the complexity of the selective harmonic minimization problem, conventional implementations are based on offline programmed PWM techniques that rely on pre-computed solutions stored either as a lookup table or as a pre-trained artificial neural network.

The hybrid analog/digital computing circuit yields a solution to the selective harmonic minimization problem in near-to-real-time and generates the associated quarter-wave symmetric PWM for a two-level, single-phase inverter. The computing circuit solves for eight independent switching angles, which enables the elimination of seven undesired harmonics while maintaining dynamic control of the modulation index. The experimental results demonstrate that the circuit can converge to the optimal solution in 3.8 ms, which is substantially faster than existing methods and facilitates real-time implementation. Moreover, the steady state power consumption of the computing circuit is approximately 700 mW, which is significantly lower than published methods for comparable applications.

The approach leverages favorable attributes of digital and analog controllers to yield a fast and scalable optimization solver. A digital microcontroller programs the cost function and other user-defined inputs to the optimization. Voltages in the circuit represent switching angles in the optimization problem. In steady state, the voltages converge to Karush-Kuhn-Tucker (KKT) points of the problem.

As an illustrative example, a specific realization of the computing circuit is disclosed that solves for eight independent switching angles for a quarter-wave symmetric PWM driven two-level single-phase inverter. Seven undesired harmonics are minimized while retaining control over the modulation index. The computing circuit is verified with simulations and a PCB hardware implementation. The experimental results demonstrate that the circuit can converge to the optimal solution in less than 5.0 ms, which is substantially faster than existing methods and facilitates real-time implementation. Moreover, the steady-state power consumption of the PCB implementation is approximately 750 mW, which is also significantly lower than published methods for comparable applications. The computing circuit is utilized to generate the PWM for a 2 kW single-phase inverter, which validates its feasibility in practical applications.

BRIEF DESCRIPTION OF THE DRAWINGS

FIG. 4A is a schematic diagram showing details of each integrator block used in the circuits of FIG. 3 and FIG. 8.

FIG. 4B is a schematic diagram showing details of each nonlinear resistor block used in the circuits of FIG. 3 and FIG. 8.

DETAILED DESCRIPTION OF THE INVENTION

The techniques disclosed herein provide an electronic circuit for solving nonlinear programming problems (NLPs). The circuit is a physical realization of the desired NLP such that voltages in the circuit represent variables in the NLP, and the interconnection of the circuit components enforce the Karush-Kuhn-Tucker (KKT) conditions on these variables. The KKT conditions provide the first order necessary conditions for the optimal solutions to the NLP given a set of constraints on the variables. Thus, in steady state, the voltages in the circuit that represent the variables of the NLP naturally converge to an optimal solution of the NLP. Particular nodes in the electronic circuit are driven by (have their voltages set by) a digital microcontroller. These voltages dictate the cost function that is minimized by the electronic circuit. In this way, the digital microcontroller can be programmed to implement arbitrary cost functions that will subsequently be minimized by the electronic circuit. The precise voltages are computed by the digital microcontroller based on voltage measurements of particular nodes from the electronic circuit.

General System Architecture

Consider a general nonlinear programming (NLP) problem, that is, we wish to minimize an arbitrary scalar cost function:

$$\varphi(\alpha_1, \alpha_2, \ldots, \alpha_N), \quad (1)$$

subject to the constraints:

$$f_1(\alpha_1, \alpha_2, \ldots, \alpha_N) \geq 0, \quad (2)$$
$$f_2(\alpha_1, \alpha_2, \ldots, \alpha_N) \geq 0,$$
$$\vdots$$
$$f_M(\alpha_1, \alpha_2, \ldots, \alpha_N) \geq 0,$$

where N is the number of variables in the NLP, and M is the number of constraints.

Figure 8:
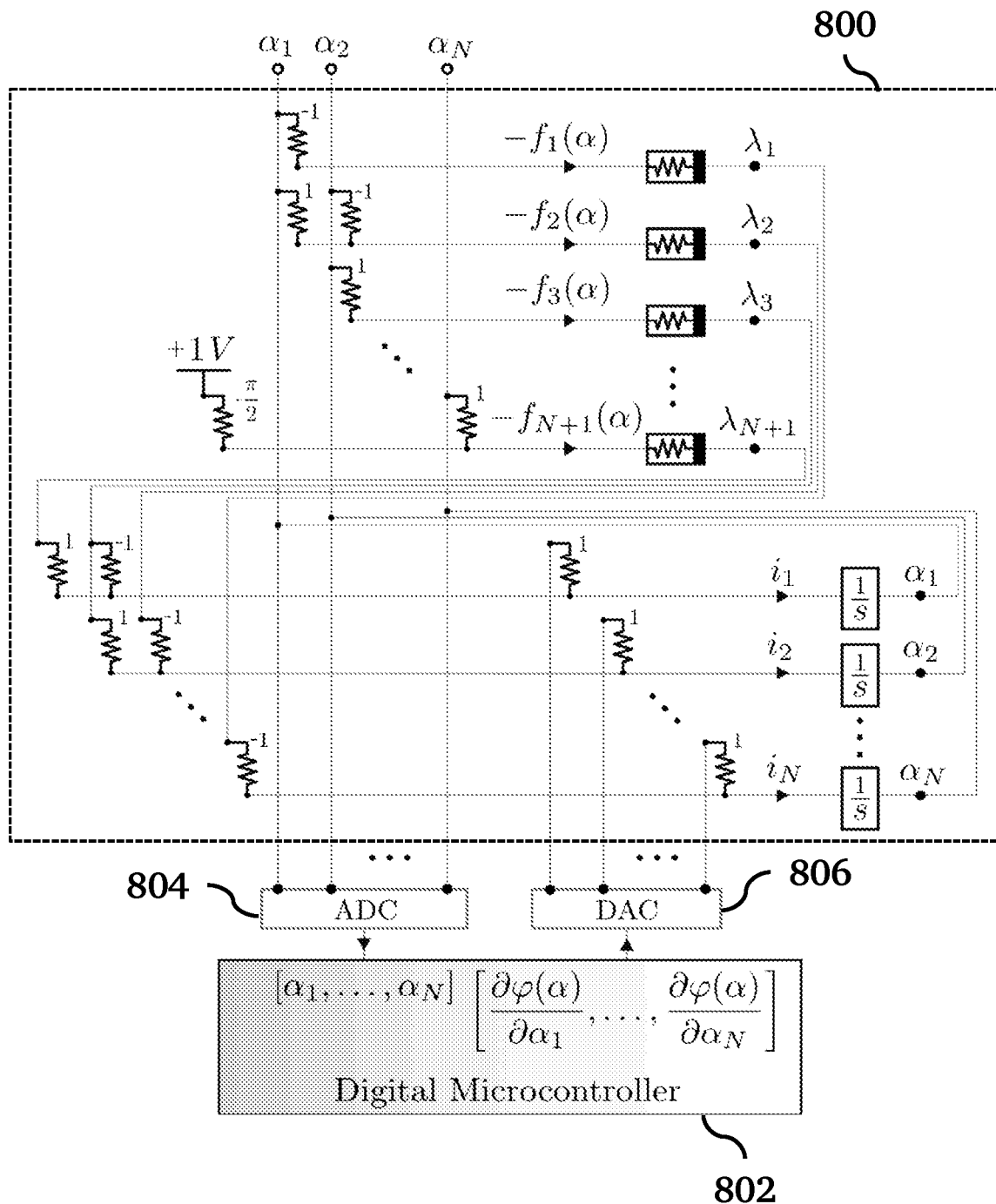
FIG. 8 is a schematic diagram showing a hybrid analog-digital circuit used to solve a NLP.

In one embodiment, the circuit in FIG. 8 may be used to solve this NLP. In this circuit, the voltages $\alpha_\ell$ are equivalent to the variables $\alpha_1, \ldots, \alpha_N$ in the NLP. We will show that, in steady state, these voltages will converge to the optimal solution min $\varphi(\alpha)=\gamma(\alpha^*)$.

The circuit in FIG. 8 has an analog circuit 800 that physically realizes a nonlinear programming problem (NLP), where voltages in the analog circuit represent variables in the NLP. The interconnection of the analog circuit components enforce Karush-Kuhn-Tucker (KKT) conditions on the variables, such that the voltages in the analogy circuit that represent the variables of the NLP naturally converge to an optimal and feasible solution of the NLP. The circuit in FIG. 8 also has a digital microcontroller 802 connected to nodes of the analog circuit. An analog-to-digital converter (ADC) 804 and a digital-to-analog converter (DAC) 806 interconnect the analog circuit 800 with the digital microcontroller 802. These connections allow the digital microcontroller to set the voltages in the analog circuit at particular nodes in the analog circuit. The voltages set at the particular nodes determine a precise cost function to be minimized by the analog circuit. Voltage measurements obtained from the analog circuit through the ADC are provided to the digital microcontroller, which uses these measurements to compute the voltages set at the particular nodes.

Fundamentally, the circuit is a physical realization of the Karush-Kuhn-Tucker (KKT) conditions that provide the first-order necessary conditions for the optimal solution $\alpha^*$. The four KKT conditions for the NLP in (1) and (2) can be formulated as follows:

$$\frac{\partial \varphi}{\partial \alpha_\ell}(\alpha^*) + \sum_{j=1}^{M} \Lambda_j^* \frac{\partial f_j}{\partial \alpha_\ell}(\alpha^*) = 0, \quad (3)$$

$$f_j(\alpha^*) \geq 0, \quad (4)$$

$$\Lambda_j^* \leq 0, \quad (5)$$

$$\Lambda_j^* \cdot f_j(\alpha^*) = 0, \quad (6)$$

where $\ell=[1, \ldots, N]$, $j=[1, \ldots, M]$, are KKT multipliers, and $f_j(\alpha)$ are constraints. When the voltages $\alpha_\ell$, the currents $f_j$, and the voltages $\Lambda_j$ in the electronic circuit satisfy (8a) (12b), the voltages given by $\alpha_\ell$ optimally solve the problem.

Arbitrary cost functions can be minimized by the electronic circuit through the programming and control of the digital microcontroller. The digital microcontroller controls the voltages at particular nodes in the electronic circuit. Specifically, the microcontroller computes $[\partial\varphi(\alpha)/\partial\alpha_1, \ldots, \partial\varphi(\alpha)/\partial\alpha_N]$ based on measurements of $\alpha_1, \ldots, \alpha_N$, and applies these voltages to the nodes connected to the DAC. This allows arbitrary cost functions $\varphi(\alpha)$ to be programmed by the digital microcontroller, which will subsequently be automatically minimized by the electronic circuit. Such a hybrid analog/digital circuit can be used to solve the selective harmonic minimization problem in real-time.

A Special Case: Minimizing One Harmonic

In order to build intuition for the hybrid analog/digital computing method, first we discuss as an illustrative example a special case involving the minimization of a single harmonic for a two-level single-phase inverter subject to a quarter-wave symmetric PWM scheme. The cost function and desired modulation index is determined by the digital stage of the circuit, and these can be updated in real-time. The voltages in the circuit correspond to the PWM switching angles, and in steady-state, they are feasible solutions to the optimization problem (precisely, they are Karush-KuhnTucker (KKT) points).

This example computing circuit was verified with a PCB hardware implementation that optimizes eight independent switching angles to eliminate seven undesired harmonics while maintaining control of the modulation index. The hardware implementation demonstrates convergence to the optimal solution in less than 5.0 ms, which is substantially faster than existing methods and facilitates real-time implementation. Moreover, the steady-state power consumption of the PCB implementation is approximately 750 mW, which is also significantly lower than published methods. The computing circuit is utilized to generate PWM signals for a 2 kW single-phase inverter, which validates its performance and feasibility in practical applications.

Problem Formulation

Figure 1:
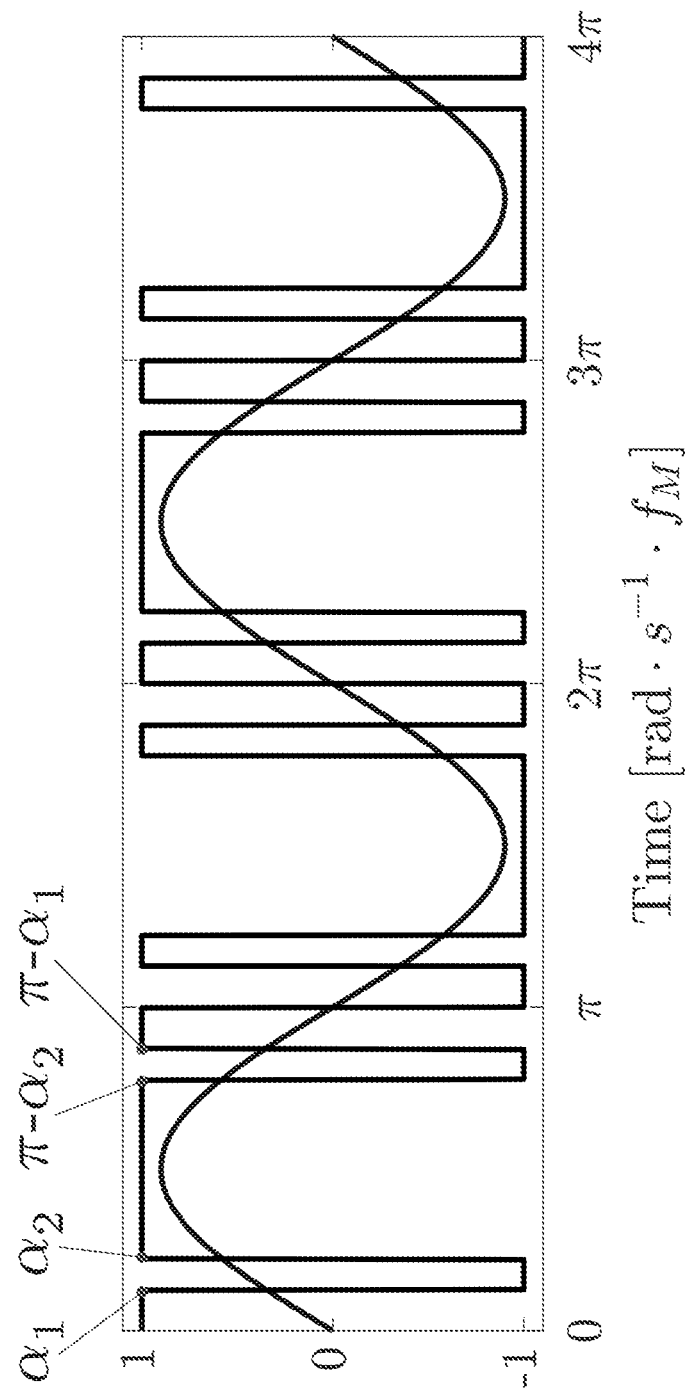
FIG. 1 is a graph of amplitude vs time that illustrates an example quarter-wave symmetric PWM waveform with two switching angles.

FIG. 1 is a graph of amplitude vs time that illustrates an example quarter-wave symmetric PWM waveform with a fundamental modulation frequency $f_m$ with two switching angles $\alpha=[\alpha_1, \alpha_2]$. In this example, we will focus on the goal of eliminating the third harmonic. The selective harmonic minimization problem takes the form:

$$\min_{\alpha_1,\alpha_2} \varphi(\alpha) = \quad (7a)$$

$$(1 + 2(-\cos\alpha_1 + \cos\alpha_2) - m)^2 + (1 + 2(-\cos 3\alpha_1 + \cos 3\alpha_2))^2$$

$$\text{s.t.} \quad f_1(\alpha) = \alpha_1 \geq 0, \quad (\lambda_1) \quad (7b)$$

$$f_2(\alpha) = \alpha_2 - \alpha_1 \geq 0, \quad (\lambda_2) \quad (7c)$$

$$f_3(\alpha) = -\alpha_2 + \pi/2 \geq 0, \quad (\lambda_3). \quad (7d)$$

The constraints $f_1(\alpha)$, $f_2(\alpha)$, $f_3(\alpha)$ ensure the correct ordering and bounds on the switching angles $$\left(0 \leq \alpha_1 \leq \alpha_2 \leq \frac{\pi}{2}\right),$$

and corresponding Lagrange multipliers are denoted by $\lambda_1$, $\lambda_2$, $\lambda_3$, respectively. In what follows, we will leverage the notation $f(\alpha)=[f_1(\alpha), f_2(\alpha), f_3(\alpha)]^T$ and $\lambda=[\lambda_1, \lambda_2, \lambda_3]^T$.

Figure 2:
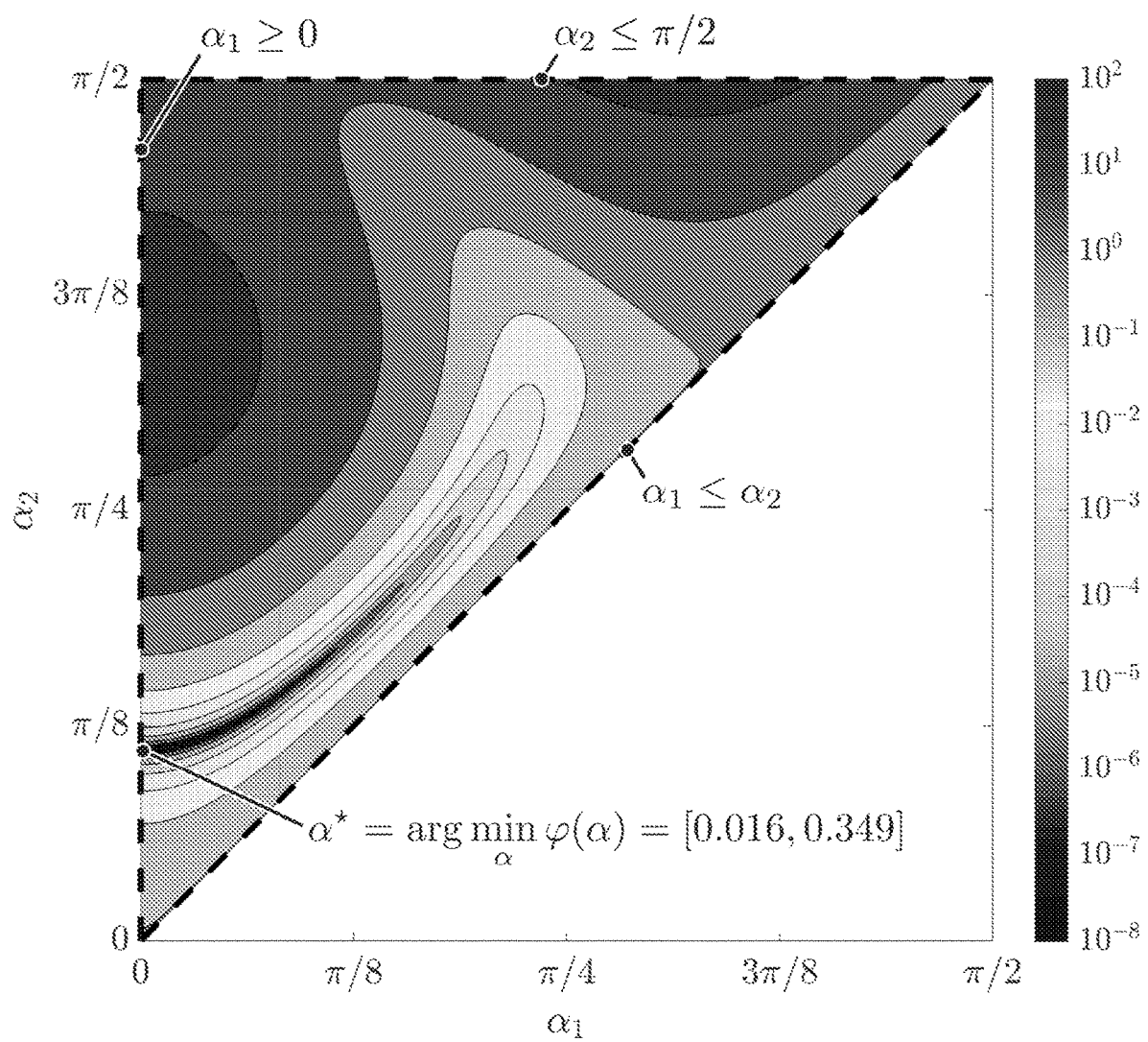
FIG. 2 is a plot of a cost function $\varphi(\alpha)$ projected on a two-dimensional plane spanned by two switching angles.

For a modulation index, m=0.9, FIG. 2 depicts the cost function $\varphi(\alpha)$ from (7a) projected on a two-dimensional plane with the constraints in (7b)-(7d) shown as dashed lines. The cost function is plotted as a function of $\alpha_1$ and $\alpha_2$. The constraints in (7b)-(7d) bound the feasible solution space of $\varphi(\alpha)$. The cost function has a minimum at $\alpha=[0.016, 0.349]$. The function is non-convex, but we can clearly visualize a global minimum. Indeed, obtaining solutions from such visualizations is impossible when scaling the selective harmonic minimization problem to higher dimensions (i.e., when there are more than two switching variables). In general, however, multiple minima may exist.

The computing circuit physically realizes the Karush-Kuhn-Tucker (KKT) conditions for the optimization problem in (7). The KKT conditions are first-order necessary conditions to guarantee a local minimum solution; such solutions are called KKT points. We denote these KKT points by $\alpha^*=[\alpha^*_1, \alpha^*_2]^T$, $\lambda^*=[\lambda^*_1, \lambda^*_2, \lambda^*_3]^T$. The KKT conditions for (7) take the form:

$$\frac{\partial \varphi(\alpha^\square)}{\partial \alpha_\ell} + \sum_j \lambda_j^* \frac{\partial f_j(\alpha^*)}{\partial \alpha_\ell} = 0, \quad \ell = 1, 2, \tag{8a}$$

$$f_j(\alpha^*) \geq 0, \quad \lambda_j^* \leq 0, \quad \lambda_j^* f_j(\alpha^*) = 0, \quad j = 1, 2, 3. \tag{8b}$$

In particular, (8a) are the so-called stationarity conditions. Furthermore, in (8b), $f_j(\alpha^*) \geq 0$ are primal feasibility conditions, $\lambda_j^* \leq 0$ are dual feasibility conditions, and $\lambda_j^* f_j(\alpha^*) = 0$ are complementary-slackness conditions. Given the constraints in (7b)-(7d), it follows that:

$$\frac{\partial f_1}{\partial \alpha} = [1, 0], \quad \frac{\partial f_2}{\partial \alpha} = [-1, 1], \quad \frac{\partial f_3}{\partial \alpha} = [0, -1]. \tag{9}$$

It is relevant to note that the KKT conditions in (8a) and (8b) have been shown to be continuous or Lipschitz continuous for parametric optimization (the modulation index m being the exogenous parameter in this case) under a set of mild assumptions. This is unlike the selective harmonic elimination (SHE) problem, which involves solving harmonic transcendental equations, and admit a discontinuous solution space for higher-order multilevel converters.

Circuit Realization

Figure 3:
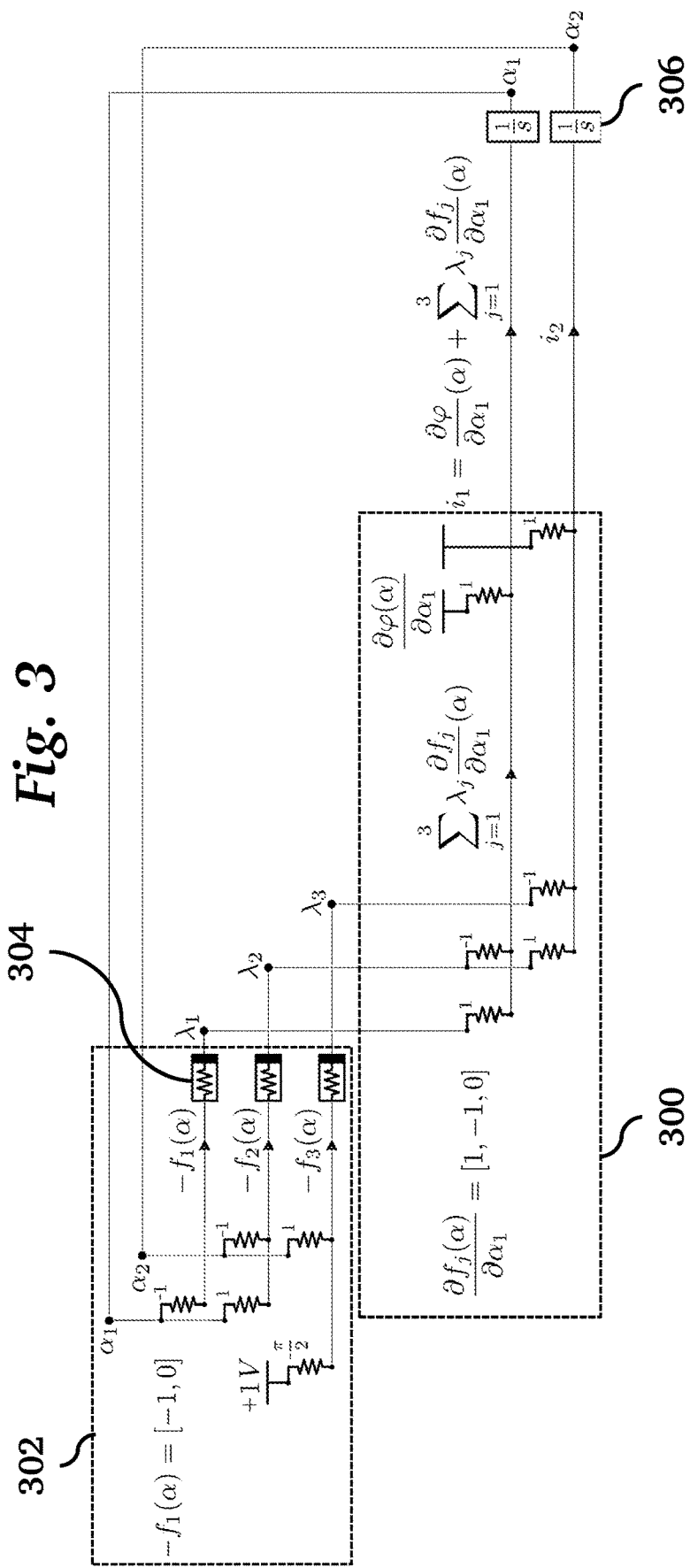
FIG. 3 is a schematic diagram of a circuit implementation of an analog computing circuit that computes optimal switching angles $\alpha^*_1$ and $\alpha^*_2$ that minimize a third harmonic in a two-level inverter.

FIG. 3 shows the circuit implementation of the analog computing circuit that yields the optimal switching angles $\alpha^*_1$ and $\alpha^*_2$ that minimize the third harmonic in a two-level inverter. In particular, the circuit minimizes the cost function (7a) subject to constraints (7b)-(7d).

We show next that, with an appropriate mapping and interpretation of the variables $\alpha$ and $\lambda$, the circuit in FIG. 3 yields solutions of the KKT conditions (8a)-(8b). In this circuit, the primal variables, $\alpha_1$, $\alpha_2$ and dual variables, $\lambda_1$, $\lambda_2$, $\lambda_3$, are voltages at specific nodes; and constraints $f_1$, $f_2$, $f_3$ are currents on specific branches. Moreover, note that resistors are labeled with conductances normalized to a 10 kΩ resistor ($R_{nom}$), and negative resistors are realized by connecting one terminal of the resistor to an inverted output of the equivalent voltage (e.g., the $-\alpha_\ell$ terminal in FIG. 4A). The implementation of these inverted voltage rails is straightforward and simply involves an inverting op-amp network.

Notice that the resistive network 300 encodes the sensitivities of the constraints with respect to the optimization variables (9). Likewise, the resistive network 302 yields currents that capture the functional form of the constraints in (7b)-(7d). The cost function dynamics of $\varphi(\alpha)$ are introduced to the circuit by time-varying controlled voltage sources with values precisely equal to $\partial \varphi(\alpha)/\partial \alpha_\ell$. The implementation of these controlled voltage sources is elaborated on below. As we will show through forthcoming developments, the circuit is constructed in a manner such that the steady state values of these voltages and currents precisely satisfy the KKT conditions in (8a)-(8b). The integrator blocks (e.g., 306) and nonlinear resistor blocks (e.g., 304) depicted in FIG. 3 are shown in more detail in FIG. 4A-B.

Integrator Block

The integrator block shown in FIG. 4A is a transimpedance amplifier with the dynamics of a capacitor, that is, its output is a voltage that is proportional to the integral of the current at its input. The currents flowing into the integrators, $i_\ell$, originate from two sources. The first source is the term $\partial \varphi(\alpha)/\partial \alpha_\ell$ (from the controlled voltage sources), while the second source is from the sum of terms $\lambda_j \partial f_j(\alpha)/\partial \alpha_\ell$.

Nonlinear Resistor Block

The nonlinear resistor shown in FIG. 4B is a transimpedance amplifier with a voltage-current relationship shown in the inset graph, specifically:

$$\lambda = g(\mathcal{I}) = \begin{cases} 0 & \text{if } \mathcal{I} \leq 0 \\ -\mathcal{I}\mathcal{R} & \text{if } \mathcal{I} > 0 \end{cases}, \tag{10}$$

for some R and where $\mathcal{I}$ is the input current to the nonlinear resistor. A resistor network connects the input of the nonlinear resistors to voltages $\alpha_1$, $\alpha_2$, $\alpha_3$ such that the currents flowing into the inputs of the nonlinear resistors are $-f_1(\alpha)$, $-f_2(\alpha)$, $-f_3(\alpha)$.

Having overviewed the subsystems of the circuit realization, we now examine its steady state operation. First, consider that in steady state, the currents $i_\ell$ are zero. Given the composition of the currents, we see that this precisely maps to the KKT stationarity condition (8a). Assume that in steady state, $\alpha_j$ satisfy the constraints in (7b)-(7d), equivalently, the currents $f_j(\alpha)$ satisfy the primal-feasibility constraints in (8b). With negative (or zero) input currents to the nonlinear resistors, the output voltages of the nonlinear resistors are $\lambda_j = 0$. With this, we see that the voltages $\alpha_j$, $\lambda_j$ correspond to the KKT points, $\alpha^*_j$, $\lambda^*_j$, i.e., they satisfy all the KKT conditions in (8a), (8b). It is relevant to note that while these KKT points represent local minima of (7), they are not necessarily the global minimum, as finding the global minimum of a non-convex function such as (7a) is generally an NP-hard problem. Many conventional meta-heuristic optimization techniques (e.g., genetic algorithms, particle swarm optimization, among others) introduce noise based on a Gaussian or Boltzmann distribution to the dynamics of the optimization variable to mitigate the likelihood of falling into undesirable local minima. In the simulation and experimental results that follow, we will evaluate the effectiveness of the solution obtained at the KKT points, which will depend on the initial starting condition of the circuit and the presence of noise. We will see that the approach does not fall into undesired local minima and that the targeted harmonics are effectively minimized in the various tested scenarios. The analog realization of the circuit may provide a natural noise mechanism, similar to the artificial noise introduced in conventional meta-heuristic optimization techniques. Moreover, artificial noise or perturbations could be introduced to dynamics of the optimization variables by the digital microcontroller.

Alternatively, consider the scenario where, e.g., the constraint $f_1(\alpha)$ is not satisfied, i.e., the voltage, $\alpha_1$ is such that $f_1(\alpha) < 0$. In this case, the output of the first nonlinear resistor will be a negative voltage $\lambda_1 = -f_1(\alpha) R$. This produces a nonzero current $i_1$ at the input of the first integrator, thereby perturbing the $\alpha_1$ voltage. In all, the passive nonlinearity in (10) penalizes errors in the constraints $f_j(\alpha)$ and perturbs the voltages $\alpha_j$ in a direction to satisfy the constraints $f_j(\alpha) \geq 0$. The value of the resistance R in the nonlinear resistor block determines the magnitude of the perturbation and, thus, affects the rate of convergence to a steady state solution that satisfies the constraints.

Simulation Results

Figure 5A:
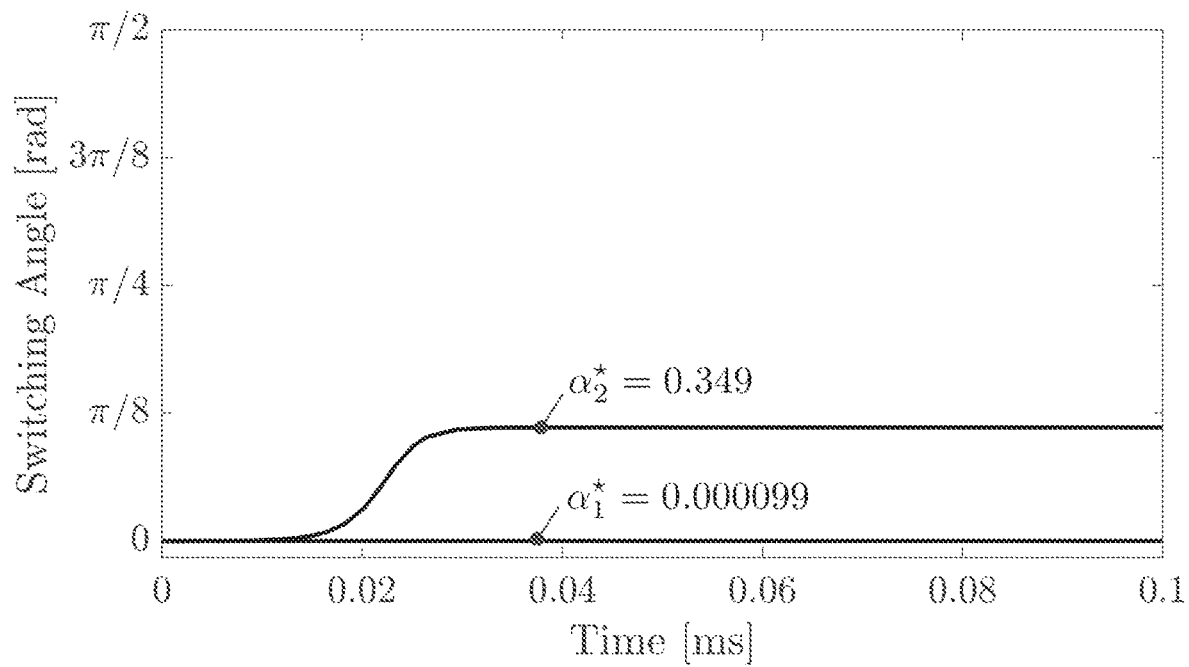
FIG. 5A is a graph of switching angle vs time, illustrating results of a simulation of the circuit of FIG. 3 minimizing a single odd harmonic.
Figure 5B:
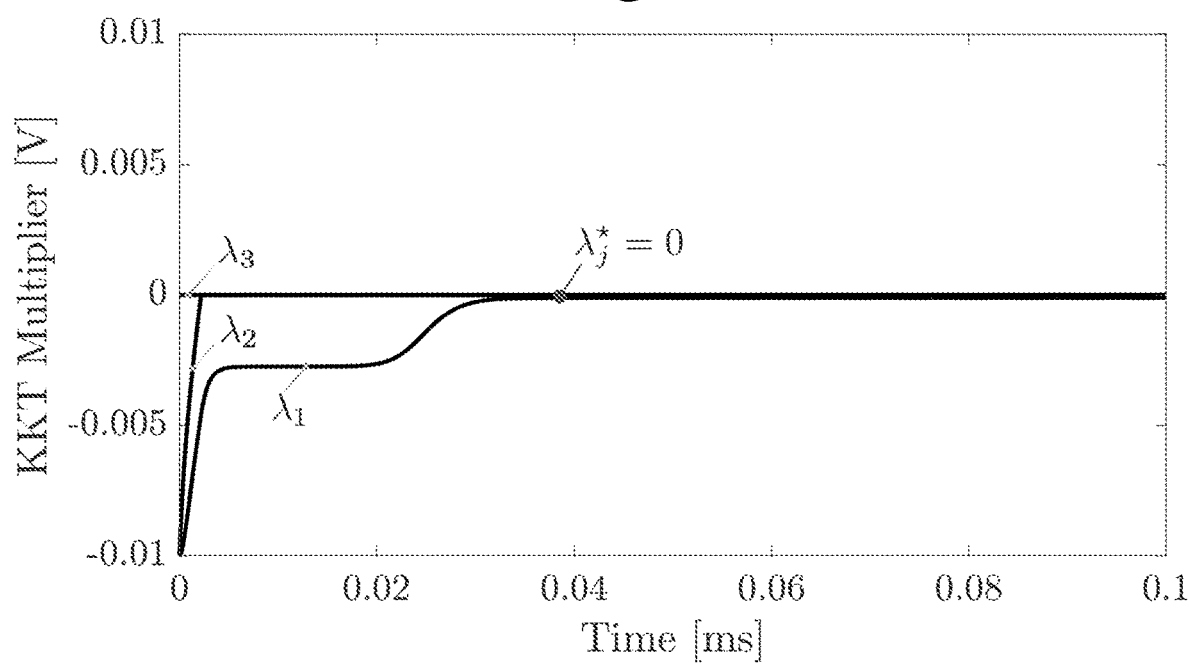
FIG. 5B is a graph of KKT multiplier voltage vs time, illustrating results of a simulation of the circuit of FIG. 3 minimizing a single odd harmonic.
Figure 5C:
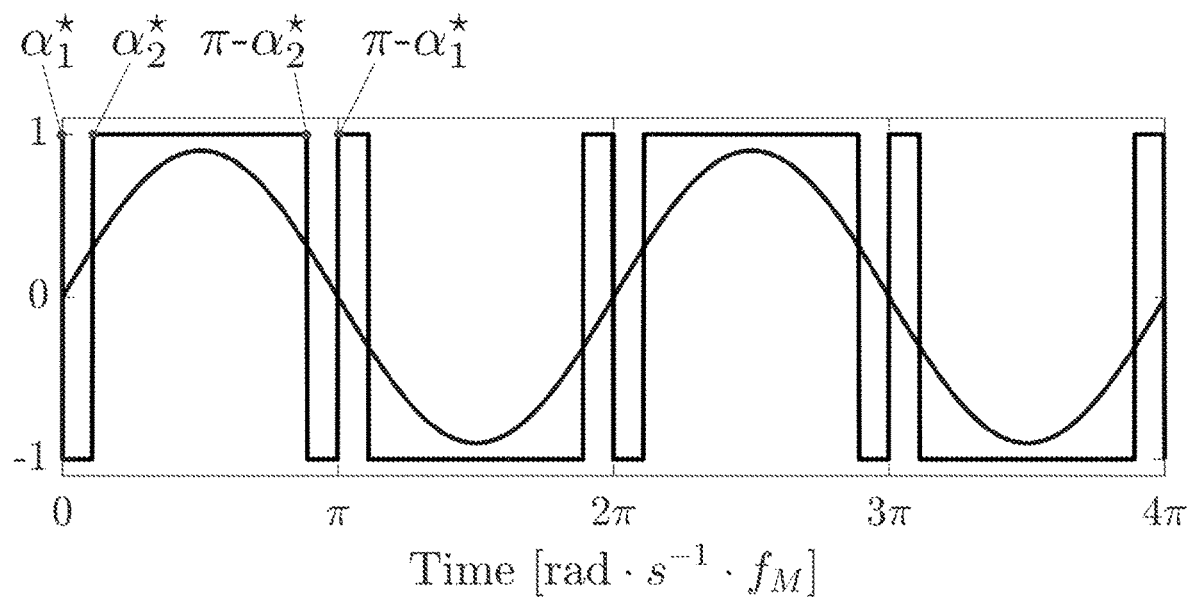
FIG. 5C is a graph of waveform amplitude vs time, illustrating results of a simulation of the circuit of FIG. 3 minimizing a single odd harmonic.
Figure 5D:
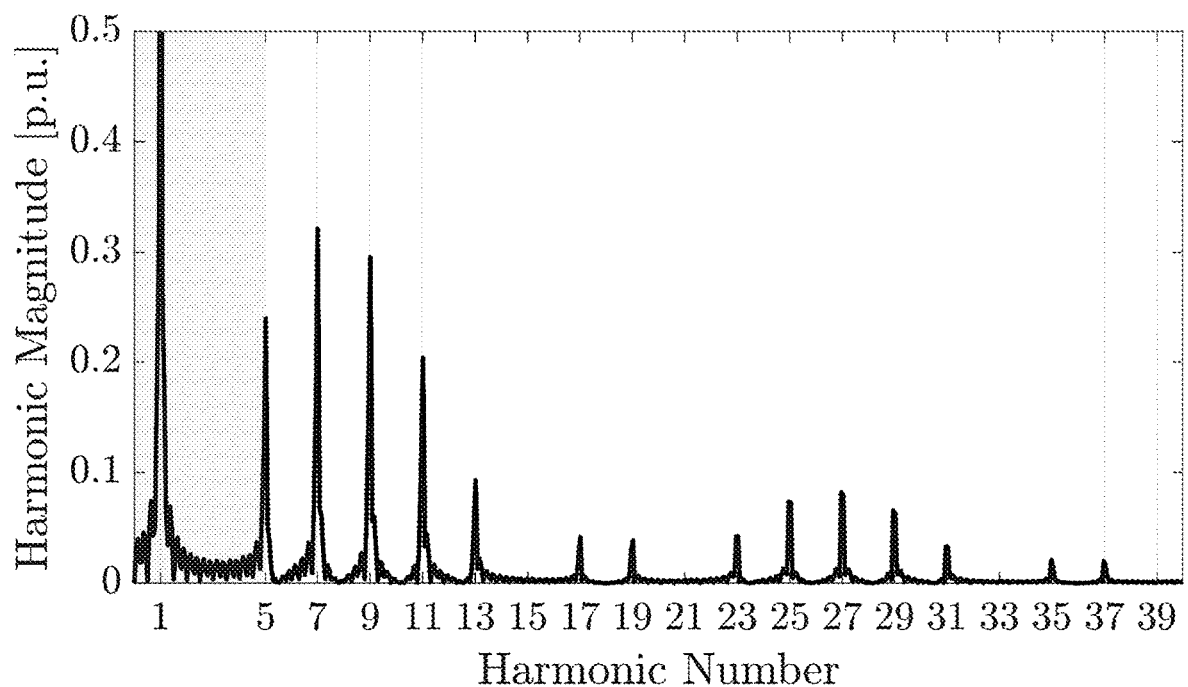
FIG. 5D is a graph of harmonic magnitude vs harmonic number of the waveform of FIG. 5C, illustrating results of a simulation of the circuit of FIG. 3 minimizing a single odd harmonic.

The computing circuit depicted in FIG. 3 minimizing a single odd harmonic was simulated using a SPICE-based simulation software. Results are shown in FIG. 5A-D. FIG. 5A depicts the evolution of voltages (equivalently, switching angles), $\alpha_1$, $\alpha_2$. They converge to the stead-state solution $\alpha^*_1 = 0.000099$ and $\alpha^*_2 = 0.349$, in approximately 38 μs. The simulated $\alpha^*_2$ exactly matches the predicted minimum of the cost function $\varphi(\alpha)$ from FIG. 2, while the simulated value of $\alpha^*_1$ is approximately the same, albeit with a 1.0% error within the $[0, \pi/2]$ variable range. As will be shown, this error imposes no practical consequences on the effectiveness of the solution. The KKT multiplier voltages, $\lambda_j$, are plotted in FIG. 5B. They are driven to zero at around the same instance as the $\alpha_j$ convergence, indicating that the switching angle voltages satisfy the constraints in (7b)-(7d). The combination of these results indicates that all KKT conditions in (8a)-(8b) are satisfied in steady state. FIG. 5C shows the optimal quarter-wave symmetric two-level waveform obtained by using the computed switching angles $\alpha^*_1$ and $\alpha^*_2$. This resulting PWM time domain waveform is shown with the associated switching instances obtained from $\alpha^*_1$ and $\alpha^*_2$ appropriately labeled. An analysis of this waveform confirms that the modulation index is 0.90 as desired. Note that for this example, there are two switching instances per quarter period, resulting in eight switching instances per period (FIG. 1). However, because the value of $\alpha^*_1 = 0.000099$ is below the minimum on-time of the control logic, two of the switching transitions per period are suppressed. A frequency domain analysis of the two-level waveform is shown in FIG. 5D, showing the minimization of the third harmonic. The third harmonic is eliminated as desired, while all other odd harmonics remain.

Transient Analysis

Next, we present a transient analysis of the switching angle and KKT multiplier voltages as a function of the nominal resistance value ($R_{nom}$) and the integrator capacitance ($C_{int}$). The results of the simulation are illustrated in FIG. 6A-B and FIG. 7A-B.

Figure 6A:
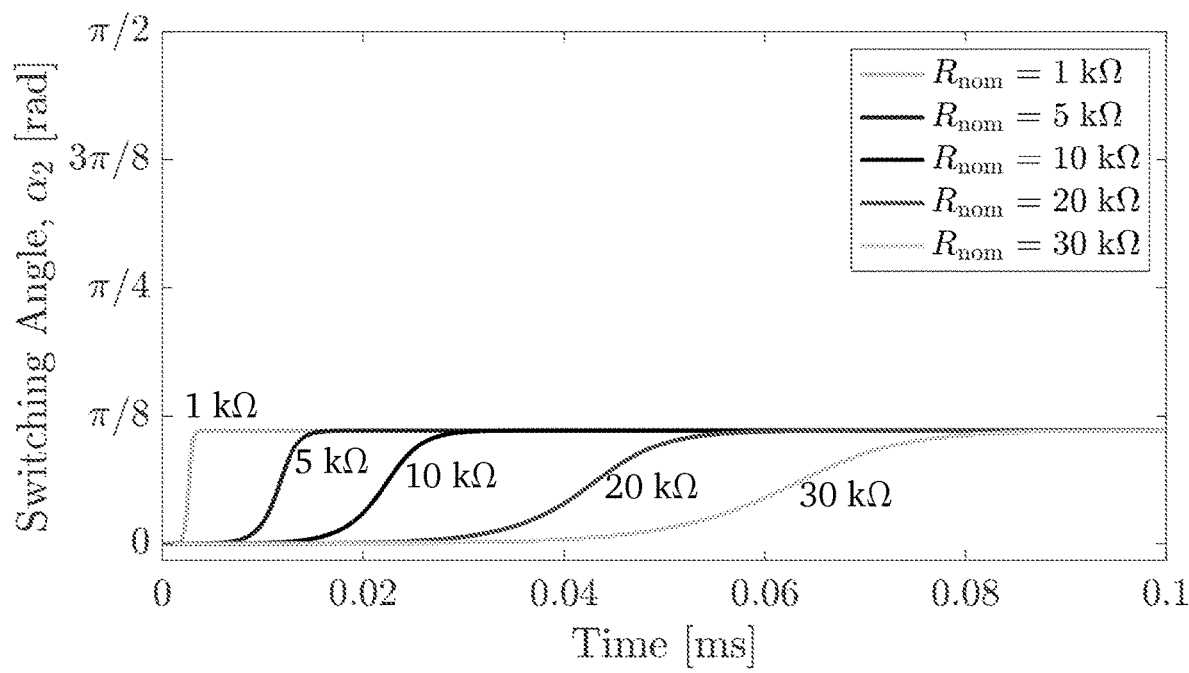
FIG. 6A is a graph of voltage of switching angle $\alpha_2$ vs time, illustrating transient analysis of a simulation of the circuit of FIG. 3 with variations in the nominal resistance.
Figure 6B:
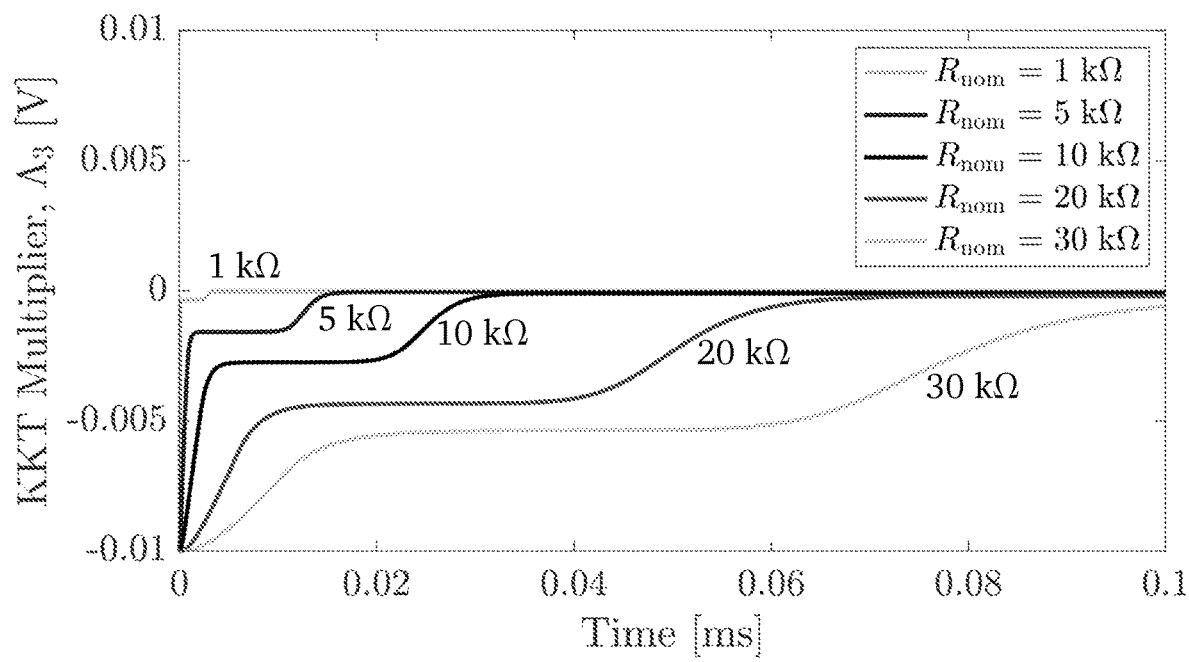
FIG. 6B is a graph of voltage of KKT multiplier vs time, illustrating transient analysis of a simulation of the circuit of FIG. 3 with variations in the nominal resistance.

Transient simulation of the computing circuit with variations in the nominal resistance value $R_{nom}$ is shown in FIG. 6A-B. In particular, FIG. 6A shows variations in the convergence of the switching angle voltage $\alpha_2$ due to varying $R_{nom}$. FIG. 6B shows variations in the convergence of the KKT multiplier voltage A3 due to varying $R_{nom}$.

Figure 7A:
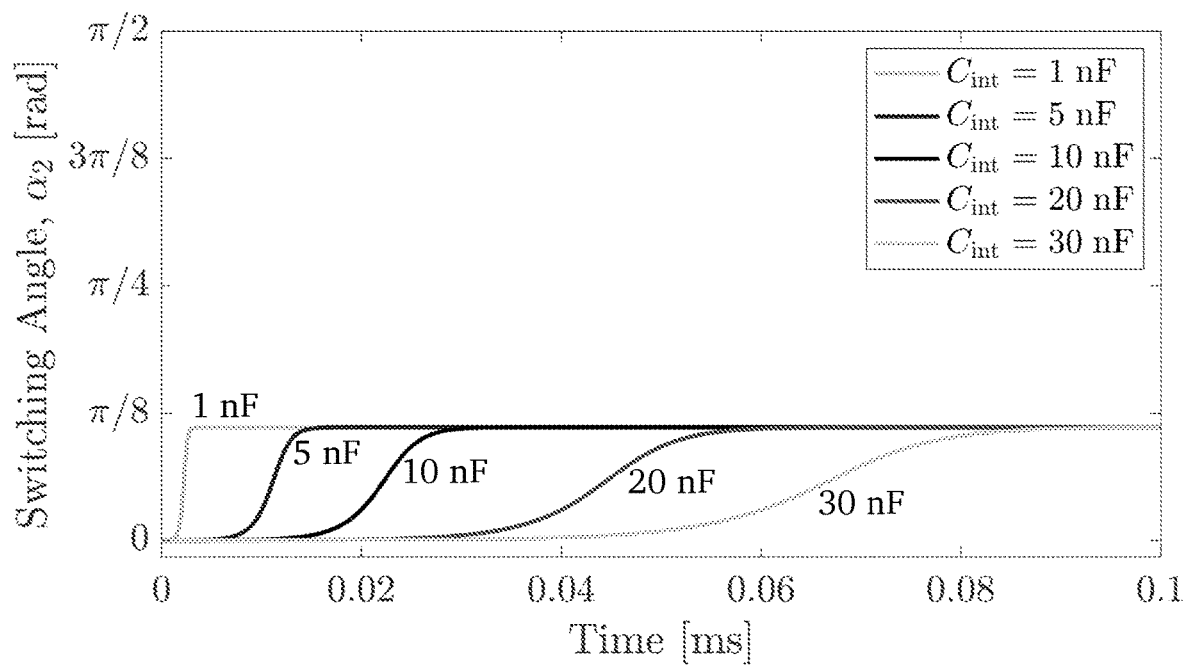
FIG. 7A is a graph of voltage of switching angle $\alpha_2$ vs time, illustrating transient analysis of a simulation of the circuit of FIG. 3 with variations in the integrator capacitance.
Figure 7B:
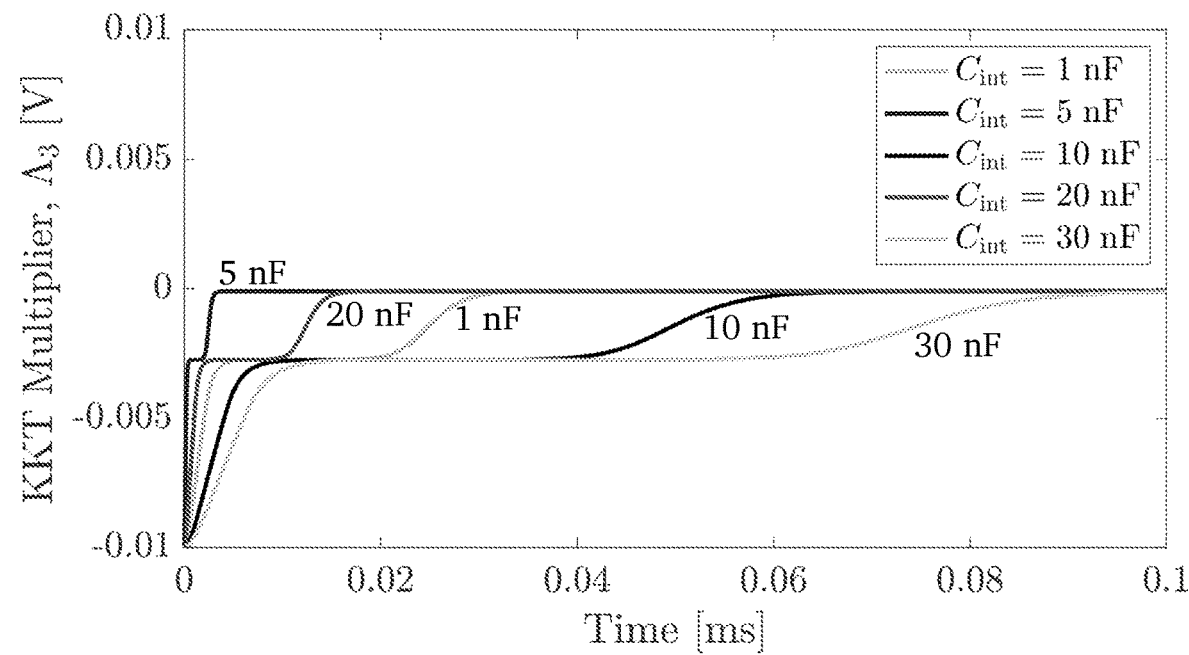
FIG. 7B is a graph of voltage of KKT multiplier vs time, illustrating transient analysis of a simulation of the circuit of FIG. 3 with variations in the integrator capacitance.

FIG. 7A-B illustrate transient simulation of the computing circuit with variations in the integrator capacitance $C_{int}$. Variations in the convergence of the switching angle voltage $\alpha_2$ due to varying $C_{int}$ are shown in FIG. 7A. Variations in the convergence of the KKT multiplier voltage $\Lambda_3$ due to varying $C_{int}$ are shown in FIG. 7B. Importantly, as shown, we see that while the values of $R_{nom}$ and $C_{int}$ affect the rate of convergence of the switching angles and KKT multiplier voltages in the circuit, they do not affect the final steady state value. Therefore, the steady state operation of the circuit will remain exactly the same. The simulation results illustrate that a larger $R_{nom}$ and a larger $C_{int}$ slow the convergence rate of the circuit, while the converse has the opposite affect. Thus, the desired rate of convergence can be tuned by selecting $R_{nom}$ and $C_{int}$. For example, a larger realization of the circuit may have more parasitics, and will require a slower transient in order to minimize ringing and to maintain the accuracy and stability. Conversely, if a design requires fast convergence, one would attempt to select the smallest possible $R_{nom}$ and $C_{int}$ while ensuring that layout parasitics are minimized as well. Such design considerations can be simulated a priori if the parasitics are modeled appropriately in the simulation model.

Generalized Hybrid Analog/Digital Computing Circuit for Selective Harmonic Minimization In this section, we consider the generalized version of the selective harmonic minimization problem leveraging intuition gleaned from the special case of eliminating one harmonic considered earlier.

Problem Formulation

The generalized version of the problem involves solving for the optimal values of N switching angles to minimize N−1 arbitrary harmonics while maintaining an arbitrary modulation index n. As before, we consider a quarter-wave symmetric PWM scheme for a two-level inverter. The precise formulation is given by:

$$\min_{\alpha=[\alpha_1,\ldots,\alpha_N]^T} \varphi(\alpha) = \tag{11a}$$

$$\left(1 + 2\sum_{\ell=1}^{N}(-1)^\ell \cos(\alpha_\ell) - m\right)^2 + \sum_{k=1}^{N-1}\left(1 + 2\sum_{\ell=1}^{N}(-1)^\ell \cos(h_k\alpha_\ell)\right)^2,$$

$$\text{s.t.} \quad f_1(\alpha) = \alpha_1 \geq 0, \; (\lambda_1), \tag{11b}$$
$$f_2(\alpha) = \alpha_2 - \alpha_1 \geq 0, \; (\lambda_2),$$
$$\vdots$$
$$f_N(\alpha) = \alpha_N - \alpha_{N-1} \geq 0, \; (\lambda_N),$$
$$f_{N+1}(\alpha) = -\alpha_N + \pi/2 \geq 0, \; (\lambda_{N+1}),$$

where $\alpha = [\alpha_1, \ldots, \alpha_N]^T$ are the N switching angles to be determined, $\lambda = [\lambda_1, \ldots, \lambda_{N+1}]^T$ are the Lagrange multipliers corresponding to the constraints $f(\alpha) = [f_1(\alpha), \ldots, f_{N+1}(\alpha)]^T$, which enforce $$0 \leq \alpha_1 \leq \ldots \leq \alpha_N \leq \frac{\pi}{2},$$

m is modulation index, and $h_1, \ldots, h_{N-1}$ are the orders of the undesired harmonics to be minimized. Depending on the application, $h_1, \ldots, h_{N-1}$ are typically chosen to be the lowest odd harmonics (i.e., 3, 5, 7, ...) or, for three-phase applications, the lowest odd nontriplen harmonics (i.e., 5, 7, 13, ...). The KKT conditions for problem (7) take the form:

$$\nabla_\alpha \varphi(\alpha^*) + (\lambda^*)^T \nabla_\alpha f(\alpha^*) = 0, \tag{12a}$$

$$f_j(\alpha^*) \geq 0, \lambda^*_j \leq 0, \lambda^*_j f_j(\alpha^*) = 0, j=1, \ldots, N+1, \tag{12b}$$

where $\nabla_\alpha \varphi(\cdot)$ captures sensitivities of the cost function with respect to the optimization variables:

$$\nabla_\alpha \varphi(\alpha) = \left[\frac{\partial \varphi(\alpha)}{\partial \alpha_1} \; \ldots \; \frac{\partial \varphi(\alpha)}{\partial \alpha_N}\right], \tag{13}$$

and $\nabla_\alpha f(\cdot)$ is the Jacobian matrix corresponding to the constraints, given by:

$$\nabla_\alpha f(\alpha) = \begin{bmatrix} \frac{\partial f_1}{\partial \alpha_1} & \frac{\partial f_1}{\partial \alpha_2} & \cdots & \frac{\partial f_1}{\partial \alpha_{N-1}} & \frac{\partial f_1}{\partial \alpha_N} \\ \frac{\partial f_2}{\partial \alpha_1} & \frac{\partial f_2}{\partial \alpha_2} & \cdots & \frac{\partial f_2}{\partial \alpha_{N-1}} & \frac{\partial f_2}{\partial \alpha_N} \\ \vdots & \vdots & \ddots & \vdots & \vdots \\ \frac{\partial f_N}{\partial \alpha_1} & \frac{\partial f_N}{\partial \alpha_2} & \cdots & \frac{\partial f_N}{\partial \alpha_{N-1}} & \frac{\partial f_N}{\partial \alpha_N} \\ \frac{\partial f_{N+1}}{\partial \alpha_1} & \frac{\partial f_{N+1}}{\partial \alpha_2} & \cdots & \frac{\partial f_{N+1}}{\partial \alpha_{N-1}} & \frac{\partial f_{N+1}}{\partial \alpha_N} \end{bmatrix} \quad (14)$$

$$= \begin{bmatrix} 1 & 0 & \cdots & 0 & 0 \\ -1 & 1 & \cdots & 0 & 0 \\ \vdots & \vdots & \ddots & \vdots & \vdots \\ 0 & 0 & \cdots & 1 & 0 \\ 0 & 0 & \cdots & -1 & 1 \end{bmatrix}.$$

Circuit Realization

FIG. 8 illustrates the circuit implementation of the generalized computing circuit to solve the optimization problem (11) that yields N optimal switching angles $\alpha_\ell^*$ that minimize N−1 arbitrary harmonics for a two-level inverter. In particular, the steady-state values of voltages $\alpha_1, \ldots, \alpha_N$ and $\lambda_1, \ldots, \lambda_{N+1}$ converge to $\alpha^*_1, \ldots, \alpha^*_N$ and $\lambda^*_1, \ldots, \lambda^*_{N+1}$ respectively, which satisfy the KKT conditions (12a)-(12b). The circuit minimizes the cost function of (11a) with the constraints of (11b). The resistors are labeled with conductances normalized to a 10 kΩ resistor, and negative resistors are realized by connecting one terminal of the resistor to an inverted output of the equivalent voltage.

The computing circuit merges an analog system 800 composed of a resistor network, integrators (FIG. 4A), and nonlinear resistors (FIG. 4B), with a digital system 802 composed of a digital microcontroller. Analog-to-digital converter (ADC) 804 and digital-to-analog converter (DAC) 806 connect the analog and digital systems. The resistive network on the bottom left of the analog system encodes the sensitivities of the constraints with respect to the optimization variables as described by the Jacobian in (14). The resistive network on the top left of the analog system yields currents that capture the functional form of the constraints in (11b). The digital microcontroller interfaces with particular nodes in the resistive network through the ADCs and DACs. The microcontroller computes $\partial\varphi/\partial\alpha_\ell$ based on measurements of $\alpha_\ell$. The programmed cost function includes the harmonics $h_1, \ldots, h_{N-1}$ that are to be minimized, along with the modulation index n of the two-level waveform. Notably, these parameters can be changed in real-time and the circuit will then dynamically converge to a new solution.

The operation of this circuit is largely similar to that of the circuit of FIG. 3 discussed above. In particular, steady-state values of the currents, $i_\ell, \ell = 1, \ldots, N$ are all zero, and the constitution of these currents implies that this steady-state operating condition satisfies the stationarity condition (12a). Furthermore, the non-linear resistors operate in concert with the integrators to ensure that voltages, $\lambda^*_1 \leq 0, \ldots, \lambda^*_{N+1} \leq 0$ and currents $f_1(\alpha^*) \geq 0, \ldots, f_{N+1}(\alpha^*) \geq 0$.

Experimental Validation

In this section, we present a printed circuit board (PCB) prototype implementation of the computing circuit that solves the selective harmonic minimization problem with eight independent switching angles, that is, N=8, for an effective switching frequency of 8×4×60 Hz=1920 Hz. The PCB implementation, moreover, generates the associated PWM signals to control a 2 kW single-phase inverter, from which we measure the output voltage to verify the minimization of the seven (N−1) desired harmonics.

Figure 9:
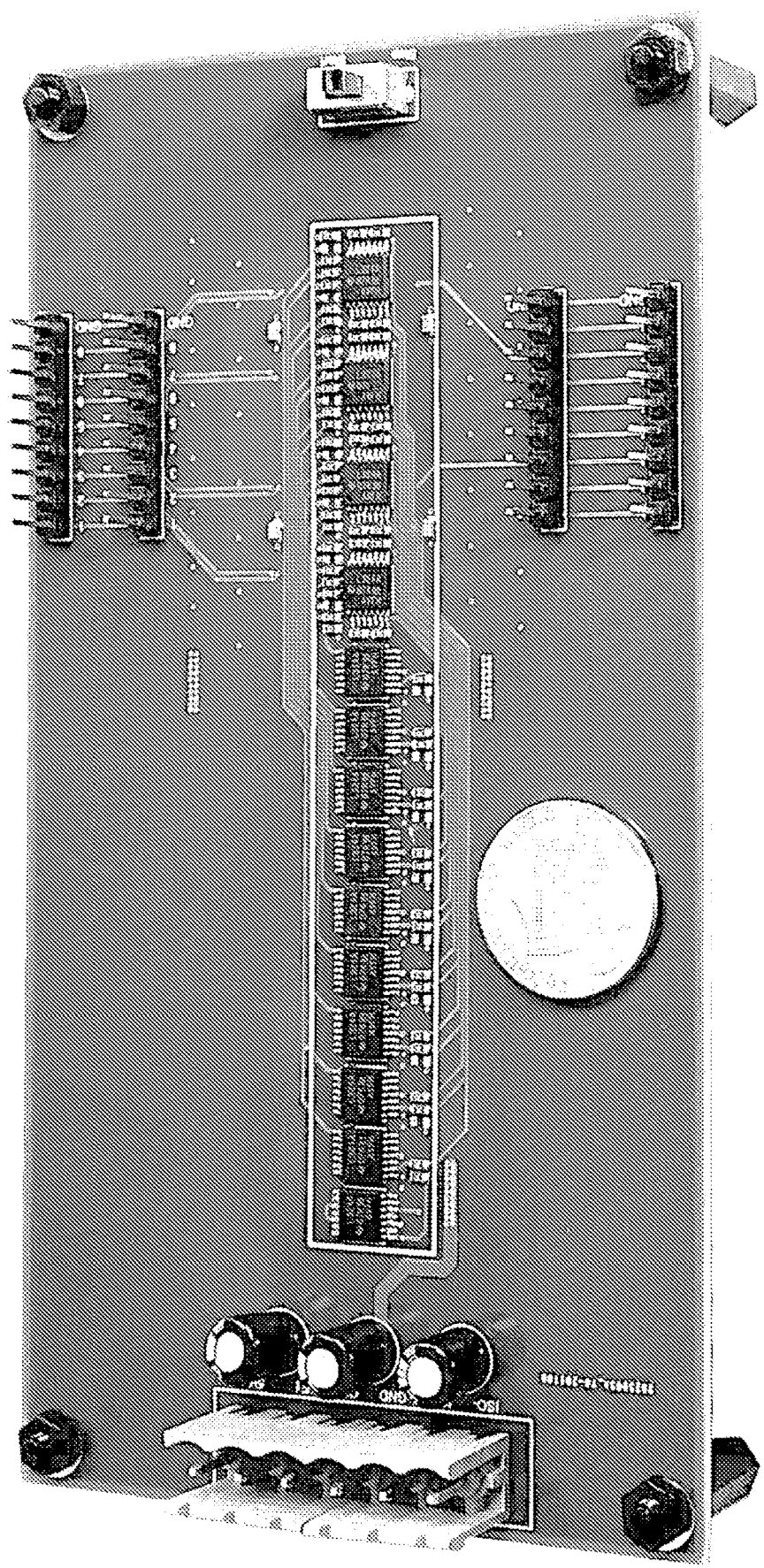
FIG. 9 is a photograph of a hardware implementation of the computing circuit of FIG. 8.

FIG. 9 is a photo of the hardware implementation of the computing circuit with a US 1 cent coin shown for scale. The central rectangular area of the circuit with integrated circuits measures 3.925×0.535 inches. The remaining area of the PCB is used for power connectors, voltage measurement test points, signal connectors to the single-phase inverter, and a physical switch for starting the computation or resetting the voltages $\alpha_\ell$ to a predefined initial condition.

The analog system is implemented with 14 LM324 general purpose quad op amps, 111 SMD 0603 resistors, 26 SMD 0603 capacitors, and 9 SOT-23 diodes connected as to realize the circuit diagram in FIG. 8. The analog components used in the circuit are generally robust to temperature variations up to 125° C. and other operating variations, and, moreover, can be implemented using robust automotive grade components if high precision or operation in harsh conditions are required. The analog system of the circuit is 'fixed' (i.e., unchanged between different experiments) for N=8 and for the constraints $f_j \geq 0$ from (11b). The digital system is implemented with a TI Delphino F28379D microcontroller, its internal ADCs, and an LTC2666 8-channel 16-bit DAC. The microcontroller samples $\alpha_1, \ldots, \alpha_8$ through the ADC, computes $\partial\varphi/\partial\alpha_1, \ldots, \partial\varphi/\partial\alpha_8$, and feeds the result back to the analog system through the DAC. The function $\varphi(\alpha)$ is programmed according to the harmonics to be minimized and the desired modulation index, and can be updated in real-time. The microcontroller also contains logic to generate the quarter-wave symmetric PWM based on its measurements of $\alpha_1, \ldots, \alpha_8$. The PWM output is connected to a custom-designed single-phase inverter with a dc link voltage of 400 V whose output is connected to a 100Ω resistive load. In steady state, the overall power consumption of the computing circuit, including the analog and digital systems, is approximately 750 mW. While many previous works on selective harmonic minimization do not provide data with respect to power consumption, most meta-heuristic optimizers (which many prior techniques utilize) are typically solved on a desktop computer using MATLAB or a similar software, which would consume on the order of 10's or 100's watts. Therefore, the power consumption of the computing circuit is substantially lower than such techniques. Further study is required to precisely benchmark the power consumption of existing methods used for selective harmonic minimization with the circuit.

Verification of Hardware Implementation

We now present simulation and experimental verification of the hardware implementation discussed above. We conduct three verification tests that involve the minimization of 1. the first seven odd harmonics,
2. the first seven odd nontriplen harmonics, and
3. the first seven odd nontriplen harmonics while the modulation index command, m, is time varying.

These verification tests demonstrate the speed of the computing circuit in obtaining the optimal solution, as well as the programmability and generalizability of the implementation to minimize any set of harmonics that are specified by the user. Moreover, the test in which the modulation command is varied intentionally with time demonstrates the ability of the circuit to dynamically respond to inputs and operating conditions that change the optimal solution. This is unique in the literature to the best of the authors' knowledge.

Minimization of First Seven Odd Harmonics

Figure 10A:
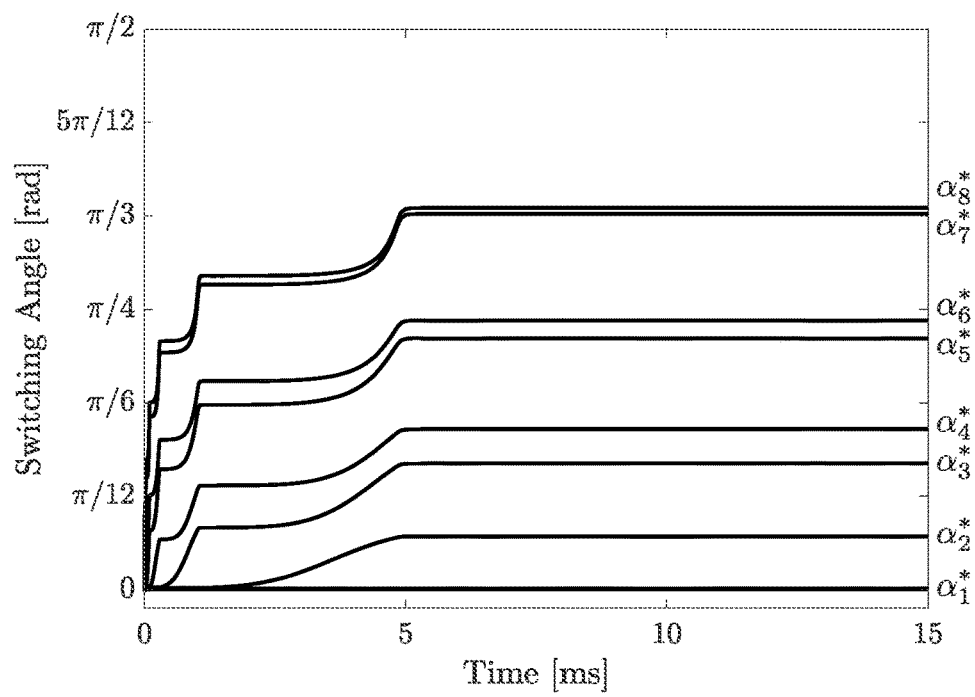
FIG. 10A is a graph of switching angle vs time, illustrating the results of a simulation of the circuit of FIG. 8 minimizing the first seven odd harmonics.
Figure 10B:
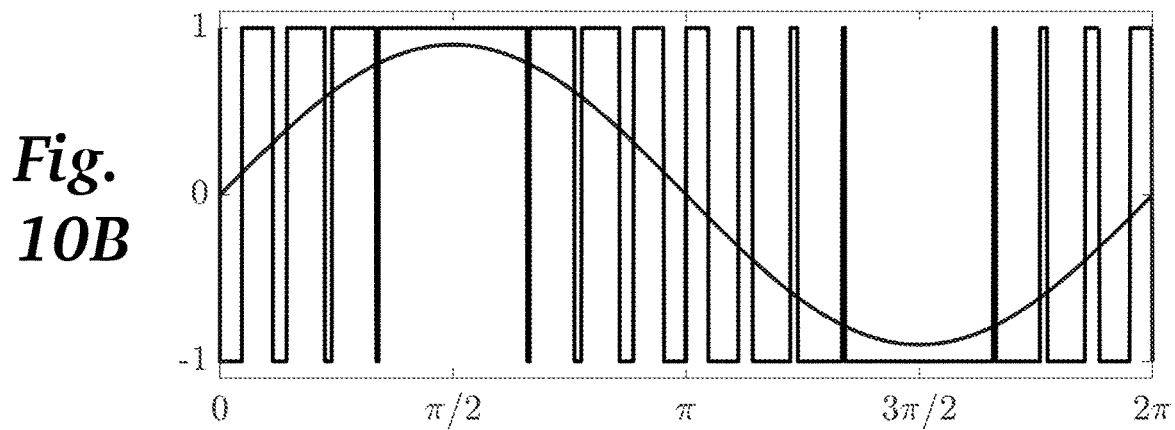
FIG. 10B is a graph of waveform amplitude vs time, illustrating the results of a simulation of the circuit of FIG. 8 minimizing the first seven odd harmonics.
Figure 10C:
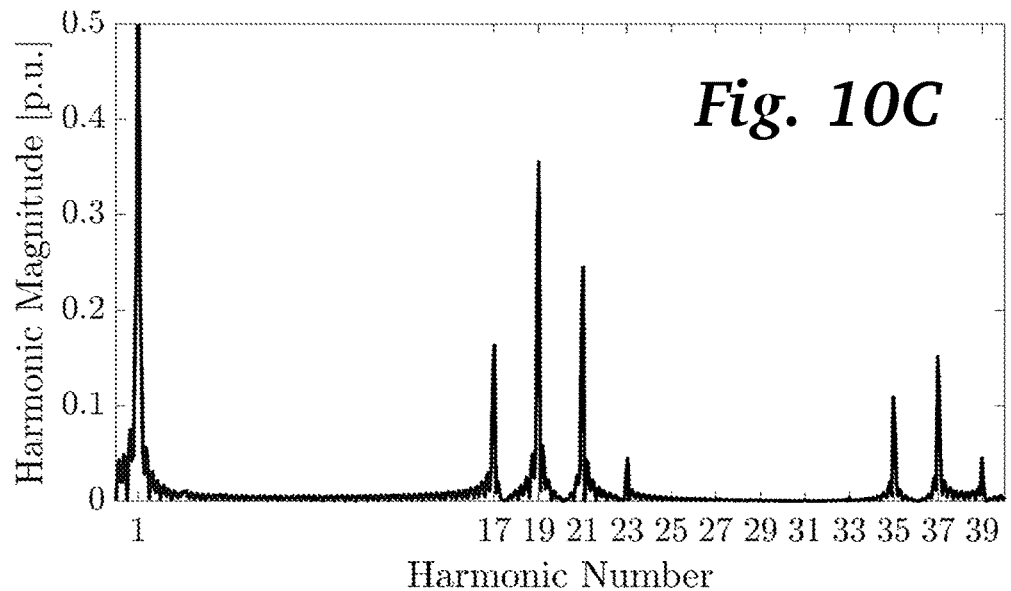
FIG. 10C is a graph of harmonic magnitude vs harmonic number of the waveform of FIG. 10B, illustrating the results of a simulation of the circuit of FIG. 8 minimizing the first seven odd harmonics.

In the first verification test, the digital system is programmed to minimize the first seven odd harmonics (h=3, 5, 7, 9, 11, 13, 15) while maintaining a constant modulation index m=0.9. FIG. 10A-C presents results from a SPICE-based simulation of this scenario.

As shown in FIG. 10A, the eight switching angle voltage variables $\alpha_\ell, \ell=1, \ldots, 8$ from the computing circuit converge in steady state to KKT points, $\alpha_\ell^*, \ell=1, \ldots, 8$ in approximately 5 ms. FIG. 10B illustrates one period of the optimal quarter-wave symmetric two-level waveform obtained by using the computed switching angles $\alpha_\ell^*$ A frequency domain analysis of this two-level waveform is shown in FIG. 10C and confirms that the first seven odd harmonics are minimized via these KKT points obtained in steady state, $\alpha_\ell^*, \ell=1, \ldots, 8$.

Figure 11A:
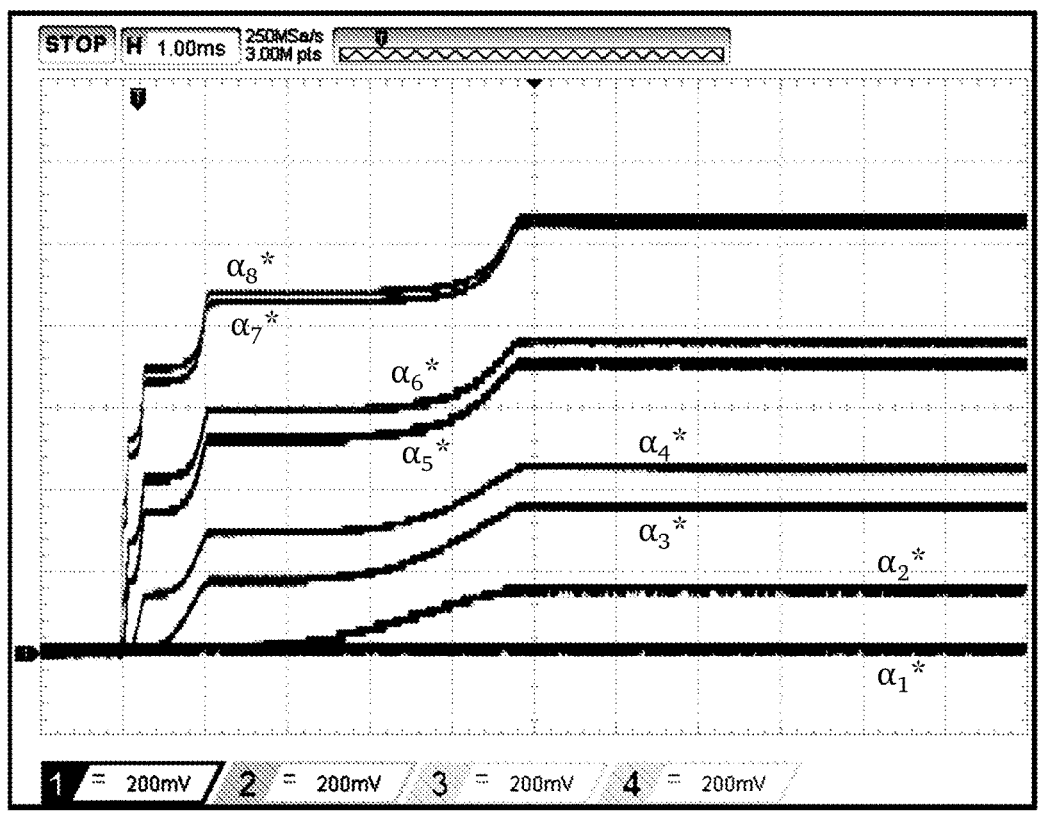
FIG. 11A is a graph of voltage measurements of switching angle voltage variables vs time, illustrating the results of experimental measurements of the circuit of FIG. 8 minimizing the first seven odd harmonics.
Figure 11B:
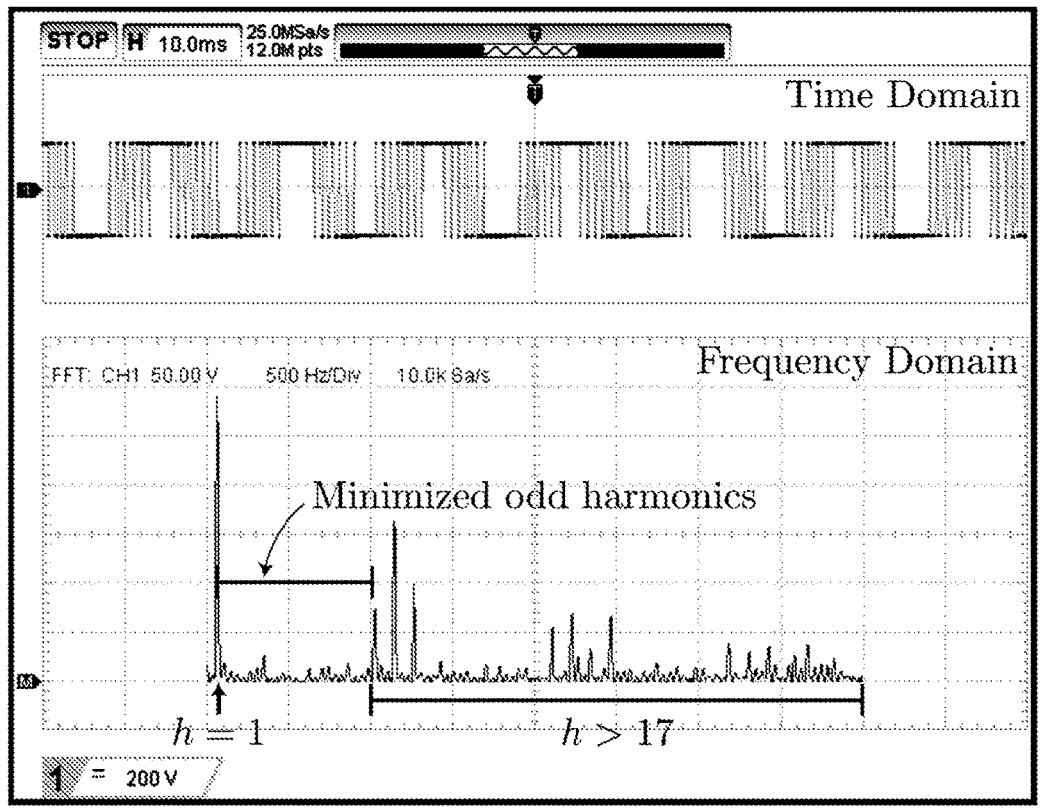
FIG. 11B shows graphs of single-phase inverter waveform in time and frequency domain, illustrating the results of experimental measurements of the circuit of FIG. 8 minimizing the first seven odd harmonics.

FIG. 11A-B illustrates experimental measurements from the hardware implementation of this circuit minimizing the first seven odd harmonics (h=3, 5, 7, 9, 11, 13, 15). As shown in FIG. 11A, voltage measurements of switching angle voltage variables $\alpha_\ell, \ell=1, \ldots, 8$ from the analog system illustrate that the circuit converges to a steady state optimal value $\alpha_\ell^*$ in 5.0 ms. The transient dynamics and steady-state values of $\alpha_\ell, \ell=1, \ldots, 8$ closely match the simulation seen in FIG. 10A. The resulting single-phase inverter waveform is shown in the time and frequency-domain analysis of FIG. 11B. As shown, the harmonics below h=17 are indeed minimized, while odd harmonics remain in the region h>17.

Minimization of First Seven Odd Nontriplen Harmonics

Figure 12A:
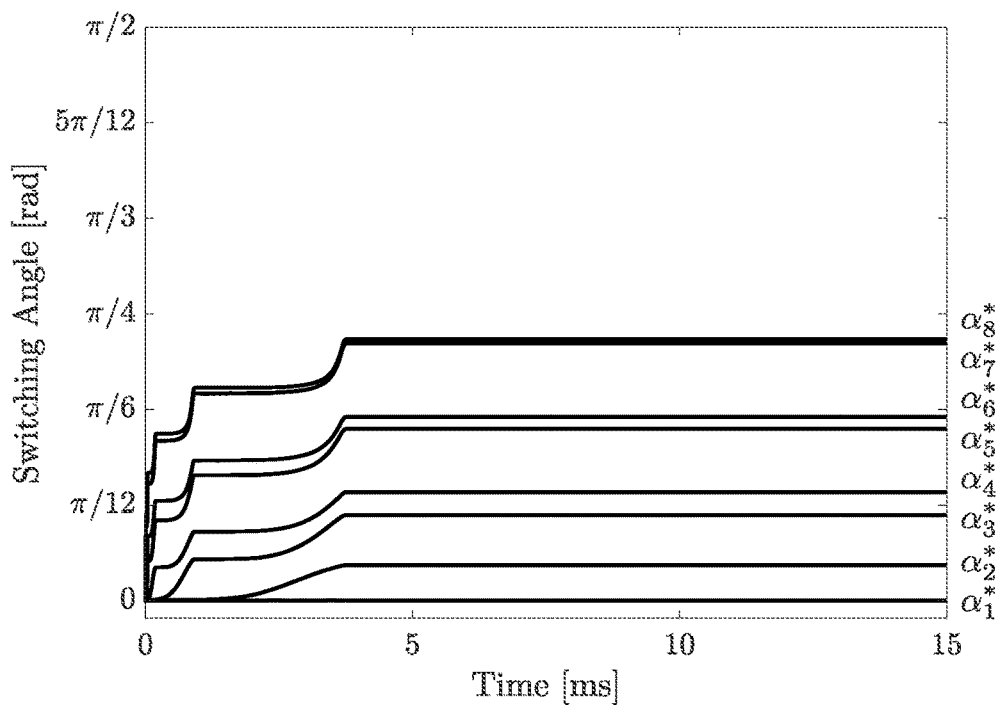
FIG. 12A is a graph of switching angle vs time, illustrating the results of a simulation of the circuit of FIG. 8 minimizing the first seven odd nontriplen harmonics.
Figure 12B:
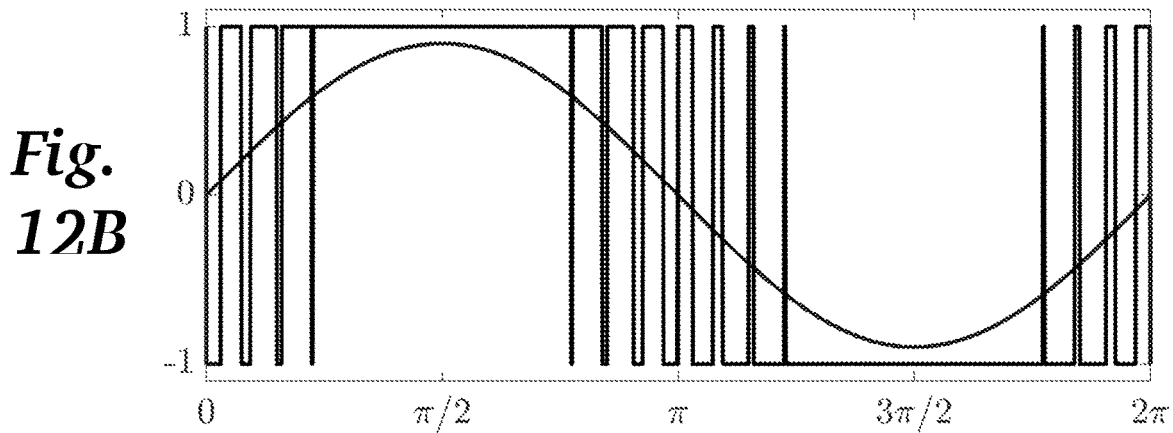
FIG. 12B is a graph of waveform amplitude vs time, illustrating the results of a simulation of the circuit of FIG. 8 minimizing the first seven odd nontriplen harmonics.
Figure 12C:
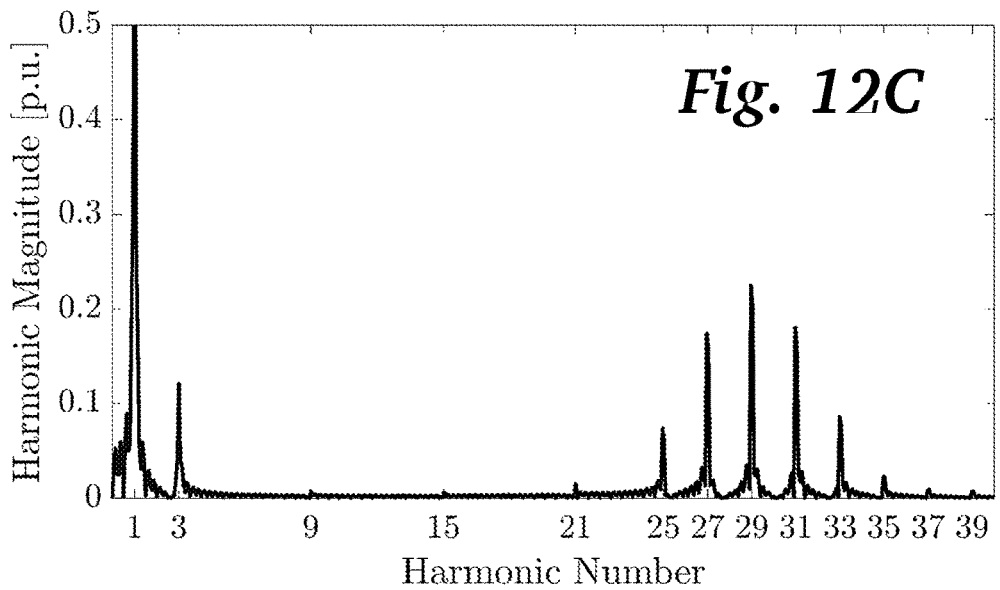
FIG. 12C is a graph of harmonic magnitude vs harmonic number of the waveform of FIG. 12B, illustrating the results of a simulation of the circuit of FIG. 8 minimizing the first seven odd nontriplen harmonics.

In this verification test, the digital system is reprogrammed to minimize the first seven odd nontriplen harmonics (h=5, 7, 11, 13, 17, 19, 23). Note that there are no modifications to the analog system of the computing circuit. A SPICE-based simulation of this scenario is shown in FIG. 12A-C. FIG. 12A shows that the switching angle voltage variables $\alpha_\ell$ converge to a KKT point in steady state that is the optimal value $\alpha_\ell^*$ in approximately 3.8 ms. FIG. 12B shows the optimal quarter-wave symmetric two-level waveform obtained by using the computed switching angles $\alpha_\ell^*$ FIG. 12C shows a frequency-domain analysis of the two-level waveform confirms the minimization of the first seven odd nontriplen harmonics. The frequency domain analysis again confirms that the specified harmonics are indeed minimized.

Figure 13A:
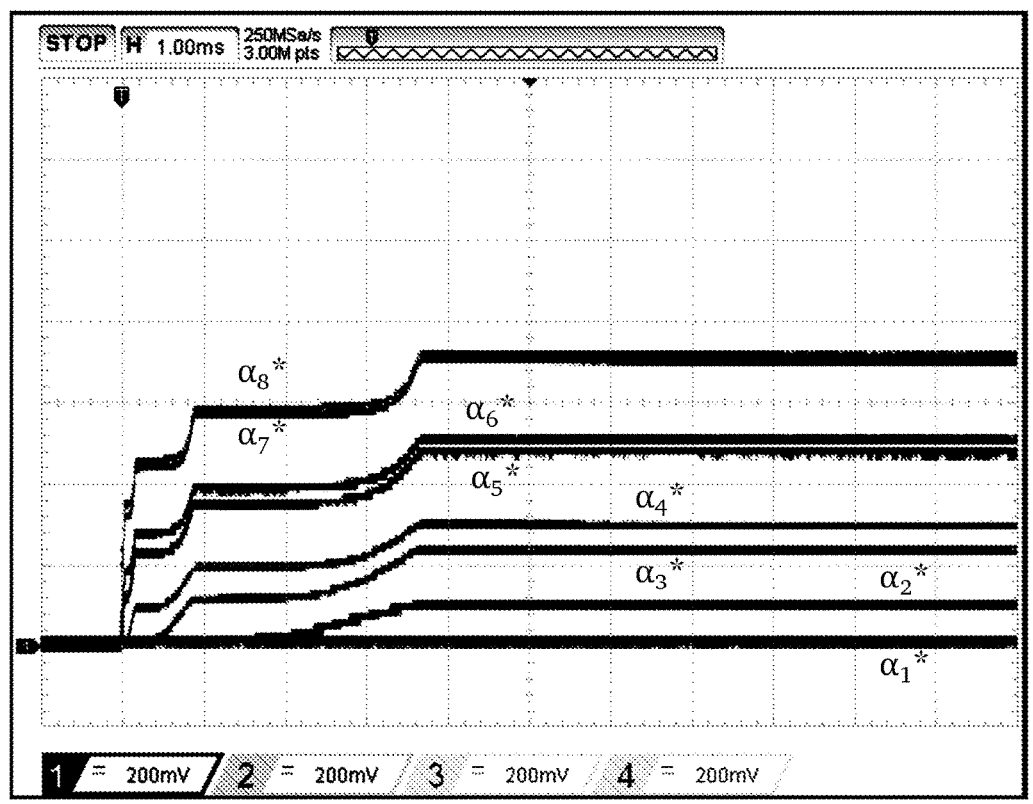
FIG. 13A is a graph of voltage measurements of switching angle voltage variables vs time, illustrating the results of experimental measurements of the circuit of FIG. 8 minimizing the first seven odd nontriplen harmonics.
Figure 13B:
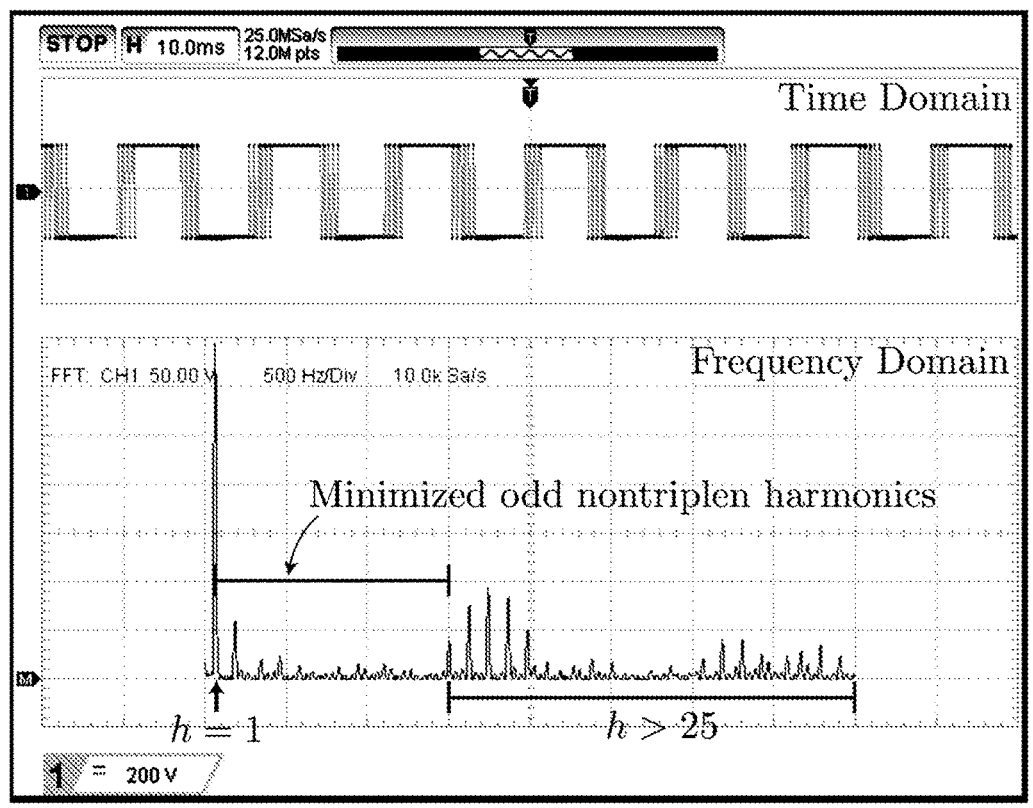
FIG. 13B shows graphs of single-phase inverter waveform in time and frequency domain, illustrating the results of experimental measurements of the circuit of FIG. 8 minimizing the first seven odd nontriplen harmonics.

The experimental measurements from the hardware implementation of the computing circuit minimizing the first seven odd nontriplen harmonics (h=5, 7, 11, 13, 17, 19, 23) are shown in FIG. 13A-B. In this case, we observe that the switching angle voltage variables $\alpha_\ell$ converge to steady state optimal value $\alpha_\ell^*$ in 3.7 ms as shown in FIG. 13A. The time and frequency-domain analysis of the resulting two-level inverter waveform is shown in FIG. 13B and confirms that the first seven odd nontriplen harmonics are minimized.

Figure 14A:
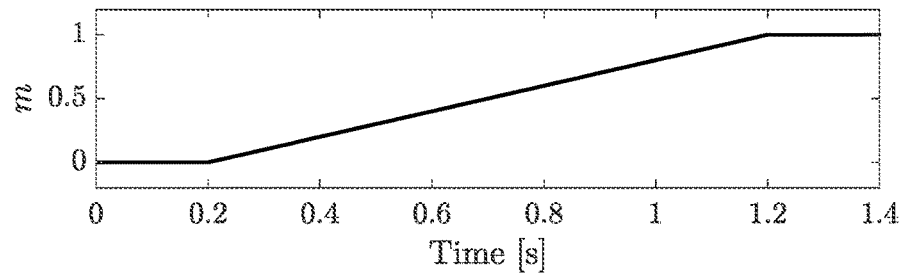
FIG. 14A is a graph of modulation index vs time, illustrating the control parameter of a simulation of the circuit of FIG. 8 minimizing the first seven odd nontriplen harmonics while varying the modulation index.
Figure 14B:
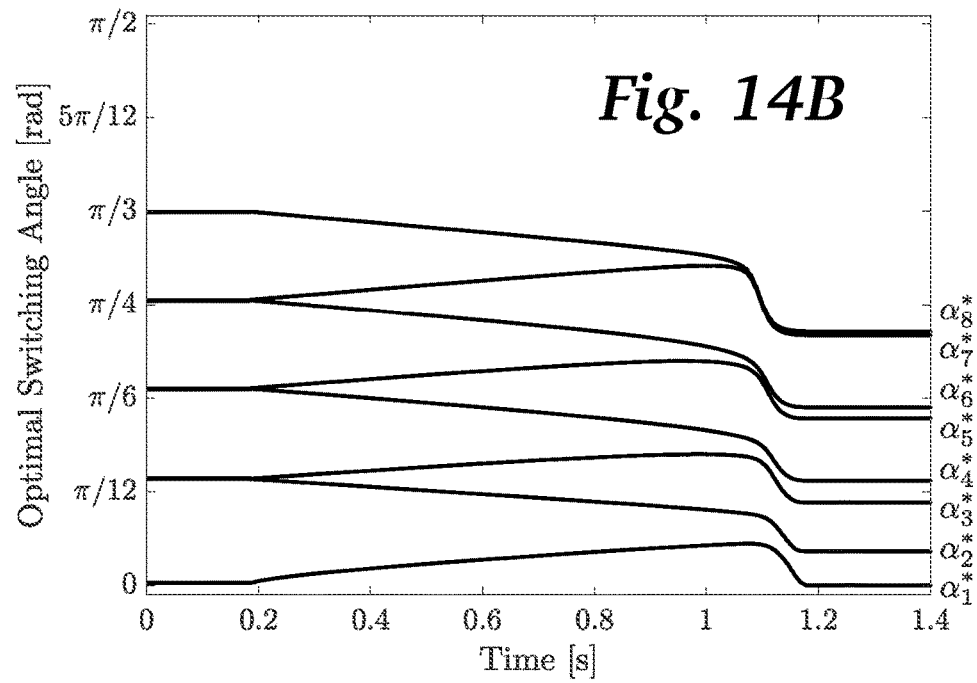
FIG. 14B is a graph of optimal switching angle vs time, illustrating results of a simulation of the circuit of FIG. 8 minimizing the first seven odd nontriplen harmonics while varying the modulation index.
Figure 14C:
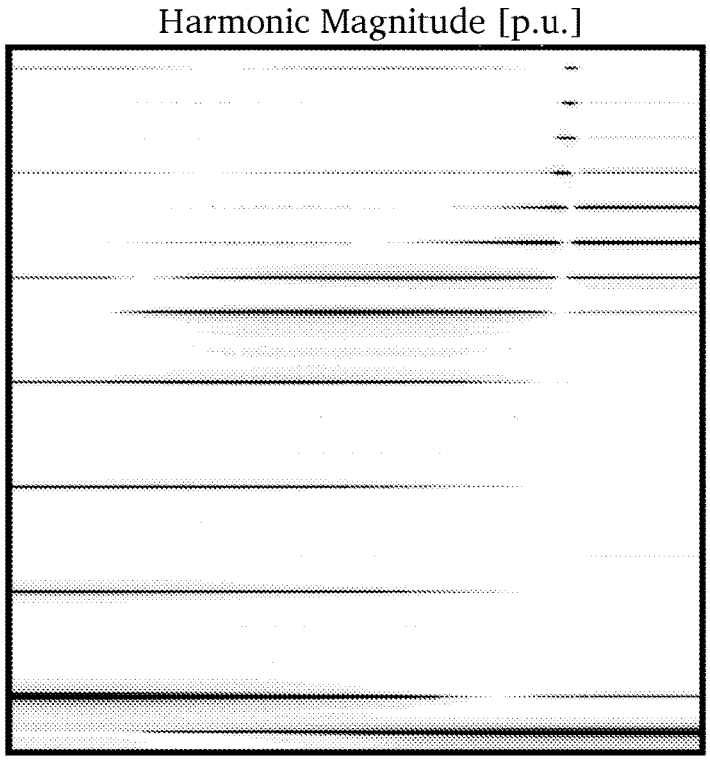
FIG. 14C is a waterfall plot that analyzes the time-varying frequency content of a resulting two-level inverter waveform, illustrating results of a simulation of the circuit of FIG. 8 minimizing the first seven odd nontriplen harmonics while varying the modulation index.

Minimization of First Seven Odd Nontriplen Harmonics With Time Varying Modulation Index Command In the third verification test, the digital system is programmed to minimize the first seven odd nontriplen harmonics while varying the modulation index. More specifically, FIG. 14A-C illustrates the SPICE-based simulation results of the computing circuit minimizing the first seven odd nontriplen harmonics (h=5, 7, 11, 13, 17, 19, 23) while dynamically controlling the modulation index, m. As shown in FIG. 14A, m is varied from 0 to 1 over 1 s from t=0.2 to t=1.2. Over this time period, as shown in FIG. 14B, the switching angle voltage variables $\alpha_\ell^*$ continuously evolve in response to the changing modulation index as the KKT points $\alpha_\ell^*$ change as a function of m. FIG. 14C shows a waterfall plot that analyzes the time-varying frequency content of the resulting two-level inverter waveform. As shown, the first seven odd nontriplen harmonics are indeed continually minimized over the entire simulation period, while the fundamental frequency (h=1) increases in magnitude due to the control of the modulation index. This test validates the dynamic tracking capability of the approach. As the commanded modulation index changes, the corresponding optimal switching angles will also change. Thus, conventional methods that rely on LUTs or ANNs are unable to address these scenarios unless the response is preprogrammed into the system. On the contrary, the computing circuit accepts the commanded modulation index as an input, and the switching angle voltage variables automatically converge to the new optimal solution.

Conclusion

We have disclosed herein a hybrid analog/digital computing circuit capable of solving NLP problems, and in particular the selective harmonic minimization problem in a fast and power-efficient manner. The experimentally verified convergence speed (<5.0 ms) and power consumption (750 mW) of the computing circuit are substantially lower than previously published works where data is available. Moreover, the circuit is capable of dynamically updating the optimization in real-time based on inputs and feedback illustrated specifically by dynamic control of the modulation index—which is unique in the selective harmonic minimization literature.

Those skilled in the art will appreciate that the principles described herein are not limited to the specific examples used for purposes of illustration. Many details could be adapted and varied based on the teachings contained herein. Other variations have also been envisioned by the inventors. For example, grid codes or uneven weighting function across the harmonics to be minimized could be incorporated by modifying the objective function. Second, while the experimental results shown here were targeted for a lower power single-phase inverter application, the circuit could be generalized for other converter configurations that have been explored in the context of selective harmonic minimization techniques, such as three-phase, multi-level, or unbalanced converters.

The invention claimed is:
1. An electronic circuit comprising:
    (a) an analog circuit that physically realizes a nonlinear programming problem (NLP) wherein voltages in the analog circuit represent variables in the NLP, and the interconnection of the analog circuit components enforce Karush-Kuhn-Tucker (KKT) conditions on the variables, such that the voltages in the analog circuit that represent the variables of the NLP naturally converge to an optimal and feasible solution of the NLP;
    (b) a digital microcontroller connected to nodes of the analog circuit;

(c) an analog-to-digital converter (ADC) and a digital-to-analog converter (DAC) that interconnect the analog circuit with the digital microcontroller; wherein the digital microcontroller sets the voltages in the analog circuit at particular nodes in the analog circuit through the DAC, wherein the voltages set at the particular nodes determine a precise cost function to be minimized by the analog circuit, wherein the voltages set at the particular nodes are computed by the digital microcontroller based on measurements obtained from the analog circuit through the ADC.

2. The method of claim 1 wherein the analog circuit comprises an integrator block implemented by a transimpedance amplifier with the dynamics of a capacitor.

3. The method of claim 1 wherein the analog circuit comprises a nonlinear resistor block implemented by a transimpedance amplifier with a voltage-current relationship of 0 voltage for input current of 0 or less, and voltage proportional to input current when the input current is positive.

* * * * *